(12) United States Patent
Kamijima et al.

(10) Patent No.: US 7,245,460 B2
(45) Date of Patent: Jul. 17, 2007

(54) MAGNETORESISTIVE EFFECTIVE TYPE ELEMENT, METHOD FOR FABRICATING THE SAME, THIN FILM MAGNETIC HEAD, MAGNETIC HEAD DEVICE AND MAGNETIC DISK DRIVE DEVICE

(75) Inventors: Akifumi Kamijima, Chuo-ku (JP); Yoichi Ishida, Chuo-ku (JP)

(73) Assignee: TDK Corporation, Tokyo (JP)

(*) Notice: Subject to any disclaimer, the term of this patent is extended or adjusted under 35 U.S.C. 154(b) by 0 days.

(21) Appl. No.: 10/176,532

(22) Filed: Jun. 24, 2002

(65) Prior Publication Data
US 2003/0007295 A1    Jan. 9, 2003

(30) Foreign Application Priority Data
Jul. 5, 2001    (JP)    ............... 2001-204619

(51) Int. Cl.
*G11B 5/33*    (2006.01)
(52) U.S. Cl. ...................... 360/322; 360/317
(58) Field of Classification Search ................ 360/322, 360/327.23, 324, 324.1, 324.2, 326, 321, 360/327.2, 327.3, 327.31, 317
See application file for complete search history.

(56) References Cited

U.S. PATENT DOCUMENTS

| | | | |
|---|---|---|---|
| 5,818,685 A * | 10/1998 | Thayamballi et al. | 360/324 |
| 5,936,810 A * | 8/1999 | Nakamoto et al. | 360/324.1 |
| 6,046,891 A * | 4/2000 | Yoda et al. | 360/324.1 |
| 6,344,954 B1 * | 2/2002 | Redon et al. | 360/324.2 |
| 6,369,992 B1 * | 4/2002 | Yoda et al. | 360/321 |
| 6,404,601 B1 * | 6/2002 | Rottmayer et al. | 360/317 |
| 6,424,508 B1 * | 7/2002 | Tadokoro et al. | 360/324.2 |
| 6,430,012 B1 * | 8/2002 | Sano et al. | 360/324.1 |
| 6,542,342 B1 * | 4/2003 | Hayashi et al. | 360/324.2 |
| 6,552,882 B1 * | 4/2003 | Hayashi | 360/324.2 |

FOREIGN PATENT DOCUMENTS

| | | |
|---|---|---|
| JP | 06-334237 | 12/1994 |
| JP | 09282618 A | 10/1997 |
| JP | 10242544 A | 9/1998 |
| JP | 2000090420 | 3/2000 |
| JP | A 2000-113416 | 4/2000 |
| JP | 2000-268322 | 9/2000 |
| JP | 2000-339639 | 12/2000 |

OTHER PUBLICATIONS

Mar. 15, 2005 Japanese Office Action in connection with JP 2001-204619.

* cited by examiner

*Primary Examiner*—Tianjie Chen
(74) *Attorney, Agent, or Firm*—Oliff & Berridge, PLC

(57) ABSTRACT

A base protective layer, a bottom shielding layer, and a bottom insulating layer 4 are formed in turn on a base made of AlTiC. Then, a magnetoresistive effective film is formed on the bottom insulating layer, and a magnetic biasing layer is formed so as to be contacted with both side surfaces of the magnetoresistive effective film which are parallel to the ABS thereof. Then, electrode layers are formed so as to be contacted with the rear surface of the magnetoresistive effective film opposite to the ABS thereof.

7 Claims, 31 Drawing Sheets

MAGNETORESISTIVE EFFECTIVE TYPE ELEMENT, METHOD FOR FABRICATING THE SAME, THIN FILM MAGNETIC HEAD, MAGNETIC HEAD DEVICE AND MAGNETIC DISK DRIVE DEVICE

BACKGROUND OF THE INVENTION

1. Field of the Invention

This invention relates to a magnetoresistive effective type element, a method for fabricating the magnetoresistive effective type element, a thin film magnetic head including the magnetoresistive effective type element, a magnetic head device and a magnetic disk drive device which include the thin film magnetic head.

2. Related Art Statement

Information is recorded and stored in a magnetic recording medium by utilizing the direction of the magnetization thereof. With the development of high density recording for a magnetic recording medium, such an attempt is made as to narrow the track width of the magnetic recording medium and thus, to develop the longitudinal recording density thereof. In this point of view, a high sensitive reading head to read out information stored in the magnetic recording medium precisely is desired. As such a high sensitive reading head, recently, a thin film magnetic head having a magnetoresistive effective type element is utilized.

FIG. 31 is a perspective view showing a conventional magnetoresistive effective type element. In FIG. 31, a magnetoresistive effective type element 10a includes a base 1 made of AlTiC or the like, a base protective layer 2, a bottom shielding layer 3 and a bottom insulating layer 4 which are stacked on the base 1 in turn. Then, a magnetoresistive effective film 5 is formed on the bottom shielding layer 4, and magnetic biasing layers 6, 6 are formed so as to be adjacent to both sides 5b of the magnetoresistive effective film 5. Then, electrode layers 7a, 7a are formed on the magnetic biasing layers 6, 6 so as to be contacted with the edge portion 5c of the top surface 5a of the magnetoresistive effective film 5.

FIG. 32 is a perspective view showing another conventional magnetoresistive effective type element. In FIG. 32, like reference numerals are imparted to similar constituent elements to those of the magnetoresistive effective type element 10a illustrated in FIG. 31, and explanation for similar constituent elements is omitted. The magnetoresistive effective type element 10b is different from the magnetoresistive effective type element 10b in the contacting condition of the electrode layers. In the magnetoresistive effective type element 10b, the electrode layers 7b, 7b are formed on the magnetoresistive effective film 5 so as to cover the edge portion 5d of the top surface 5a of the magnetoresistive effective film 5.

FIG. 33 is a cross sectional view showing the magnetoresistive effective type element 10b illustrated in FIG. 32, taken on line X-X where the top surface 5a of the magnetoresistive effective film 5 is covered with the electrode film 7b and which is perpendicular to the top surface 5a and an air bearing surface (ABS) 11. In FIG. 33, an insulating film 12 is formed at the opposite side of the magnetoresistive effective film 5 to the ABS 11 so as to have substantially the same thickness as that of the film 5. The electrode layers 7b, 7b are formed on the edge portion 5d of the top surface 5a of the magnetoresistive effective film 5 and the insulating film 12. Not depicted in those figures, a top insulating layer and a top shielding layer are stacked in turn.

In the magnetoresistive effective type elements 10a and 10b illustrated in FIGS. 31 and 32, the magnetic biasing layers 6, 6 function as their respective magnetic domain-controlling films through the application of biasing magnetic field for their respective magnetoresistive effective films 5. Also, the electrode layers 7a and 7b function as their respective leading films to supply sense currents to their respective magnetoresistive effective films 5 from external power supply. When an external magnetic field is applied to the magnetoresistive film 5, the electric resistance thereof is changed. Therefore, a given sense current is supplied to the magnetoresistive effective film 5 from the electrode layers 7a or 7b, and thus, information magnetically recorded can be read out by detecting the change in sense current depending on to the magnetic direction.

In the magnetoresistive effective type element 10b, as shown in FIGS. 32 and 33, the electrode layers 7b, 7b are formed so as to cover only the edge portion 5d of the top surface 5a of the magnetoresistive effective film 5. In the application of sense current for the magnetoresistive effective film 5, a sense current 13b is applied directly to the magnetoresistive effective film 5 from the electrode layers 7b, 7b, and a sense current 13c is applied to the magnetoresistive effective film 5 from the electrode layers 7b, 7b via the magnetic biasing layers 6, 6. In the configuration as shown in FIGS. 32 and 33, the sense current can not be applied to the magnetoresistive effective film 5 sufficiently due to the large electric resistance. In addition, large amount of heat may be generated due to the large electric resistance when the sense current is applied.

In the magnetoresistive effective type element 10a, as shown in FIG. 31, the electrode layers 7a, 7a are formed so as only to be contacted with the edge portion 5c of the top surface 5a of the magnetoresistive effective film 5. Therefore, a given sense current 13a is applied to the magnetoresistive effective film 5 from the electrode film 7a via the magnetic biasing layers 6, 6. As a result, the sense current can not be applied to the magnetoresistive effective film 5 sufficiently, and large amount of heat may be generated due to the large electric resistance.

Moreover, in the magnetoresistive effective type elements 10a and 10b, the electric resistance between reading terminals is increased as the electric resistance of the magnetoresistive effective type element 10a or 10b is increased, so that the design margin of electric circuit to process information read including an amplifier may be reduced.

SUMMARY OF THE INVENTION

It is an object of the present invention to provide a new magnetoresistive effective type element which can mitigate the above-mentioned drawbacks in the conventional magnetoresistive effective type element.

It is another object of the present invention to provide a method for fabricating the new magnetoresistive effective type element, and a thin film magnetic head, a magnetic head device and a magnetic disk drive device which include the new magnetoresistive effective type element.

For achieving the above object, this invention relates to a magnetoresistive effective type element comprising;

a magnetoresistive effective film having an air bearing surface, a top surface substantially perpendicularly continued from the air bearing surface, side surfaces continued from the top surface and a rear surface continued from the surfaces opposite to the air bearing surface, a magnetic biasing layer to apply a biasing magnetic field for the magnetoresistive effective film which is formed so as to be contacted with the surfaces of the magnetoresistive effective film, and a pair of electrode layers to flow a current for signal detection in the magnetoresistive effective film which is formed so as to be contacted with at least one portion of the rear surface of the magnetoresistive effective film. In this case, the pair of electrode layers may be contacted with both ends of the rear surface of the magnetoresistive effective film.

In the magnetoresistive effective type element of the present invention, the electrode layers are contacted with at least one portion of the rear surface of the magnetoresistive effective film as well as the top surface thereof. Therefore, the electric contacting area of the electrode layers for the magnetoresistive effective film is increased, so that the electric resistance between the electrode layers and the magnetoresistive effective film can be decreased. In the application of sense current for the magnetoresistive effective film, therefore, a given sense current can be supplied to the magnetoresistive effective film via the rear surface thereof, not via the magnetic biasing layers, so that heat generation can be reduced due to the relatively small electric resistance. Also, since the electric resistance between reading terminals is decreased, the design margin of electric circuit to process information read for the magnetoresistive effective type element can be enlarged.

Moreover, the difference between the optical track width and the magnetic track width of the magnetoresistive effective type element can be reduced. As a result, the effective track width can be maintained, so that information can be read and output sufficiently as designed.

In a preferred embodiment of the present invention, the pair of electrode layers are contacted with edge portions of the top surface of the magnetoresistive effective film. In this case, a given sense current is applied to the magnetoresistive effective film via the surface area thereof, so the electric resistance between the electrode films and the magnetoresistive effective film, and thus, heat generation can be repressed.

In another preferred embodiment of the present invention, a planarizing film is formed so as to be contacted with a lower portion of the rear surface of the magnetoresistive effective film. Then, the pair of electrode layers are formed on the planarizing film. In this case, the flatness of the magnetoresistive effective type element can be developed while the electric contact of the electrode layers to the magnetoresistive effective film is maintained sufficiently.

This invention also relates to a thin film magnetic head including, as a reading element, a magnetoresistive effective type element as mentioned above. The thin film magnetic head may comprises at least one writing element. In this case, the electric resistance of the thin film magnetic head can be reduced, and thus, heat generation can be repressed. Also, the electric resistance between the reading terminals can be reduced, and thus, the electric circuit margin to process information read including am amplifier can be enlarged.

Moreover, the difference between the optical track width and the magnetic track width can be decreased, so that the effective track width can be maintained and information can be read and output sufficiently as designed.

Moreover, this invention relates to a method for fabricating a magnetoresistive effective type element, comprising the steps of;

a first step of forming a magnetoresistive effective film uniformly on a given base, a second step of etching the magnetoresistive effective film in a direction perpendicular to an air bearing surface through milling using a first mask, a third step of forming a magnetic biasing layer so as to be contacted with both side surfaces of the magnetoresistive effective film which are formed through the milling in the second step, a fourth step of etching and removing a rear portion of the magnetoresistive effective film at a given distance from the air bearing surface through milling using a second mask, and a fifth step of forming a pair of electrode films so as to be contacted with at least one portion of a rear surface of the magnetoresistive effective film which is formed through the milling in the fourth step. The electrode layers may be contacted with both ends of the rear surface of the magnetoresistive effective film.

According to the fabricating method of the present invention, the electrode layers can be formed so that it can be contacted with at least one portion of the rear surface of the magnetoresistive effective film as well as the both ends thereof. Therefore, the electric contacting area of the electrode layers for the magnetoresistive effective film can be enlarged, so the electric resistance can be decreased.

In a preferred embodiment of the present invention, the pair of electrode layers are formed so as to be contacted with edge portions of a top surface of the magnetoresistive effective film. In this case, a given sense current is applied to the magnetoresistive effective film via the top surface thereof from the electrode layers, and thus, the electric resistance between the electrode layers and the magnetoresistive effective film can be decreased.

In another preferred embodiment of the present invention, after the fourth step and before the fifth step, a planarizing film is formed above the base so as to be contacted with a lower portion of the rear surface of the magnetoresistive effective film. Then, in the fifth step, the pair of electrode films are formed on the planarizing film. In this case, the flatness of the magnetoresistive effective type element can be enhanced while the electric contacting area of the electrode layers to the magnetoresistive effective film is maintained.

In still another embodiment of the present invention, in the fifth step, a third mask is disposed on the magnetoresistive effective film so that edge portions of a top surface and the rear surface of the magnetoresistive effective film are revealed, as viewed from an upper side of the magnetoresistive effective film, and the pair of electrode layers are formed through film-forming via the third mask.

This invention relates to a magnetic head device including a thin film magnetic head as mentioned above and a head supporting device to support said thin film magnetic head.

These and other objects, features and advantages of the present invention will become more apparent upon the following detailed description and drawings.

BRIEF DESCRIPTION OF THE DRAWINGS

For a better understanding of this invention, reference is made to the attached drawings, wherein.

DETAILED DESCRIPTION OF PREFERRED EMBODIMENTS

Figure 1:
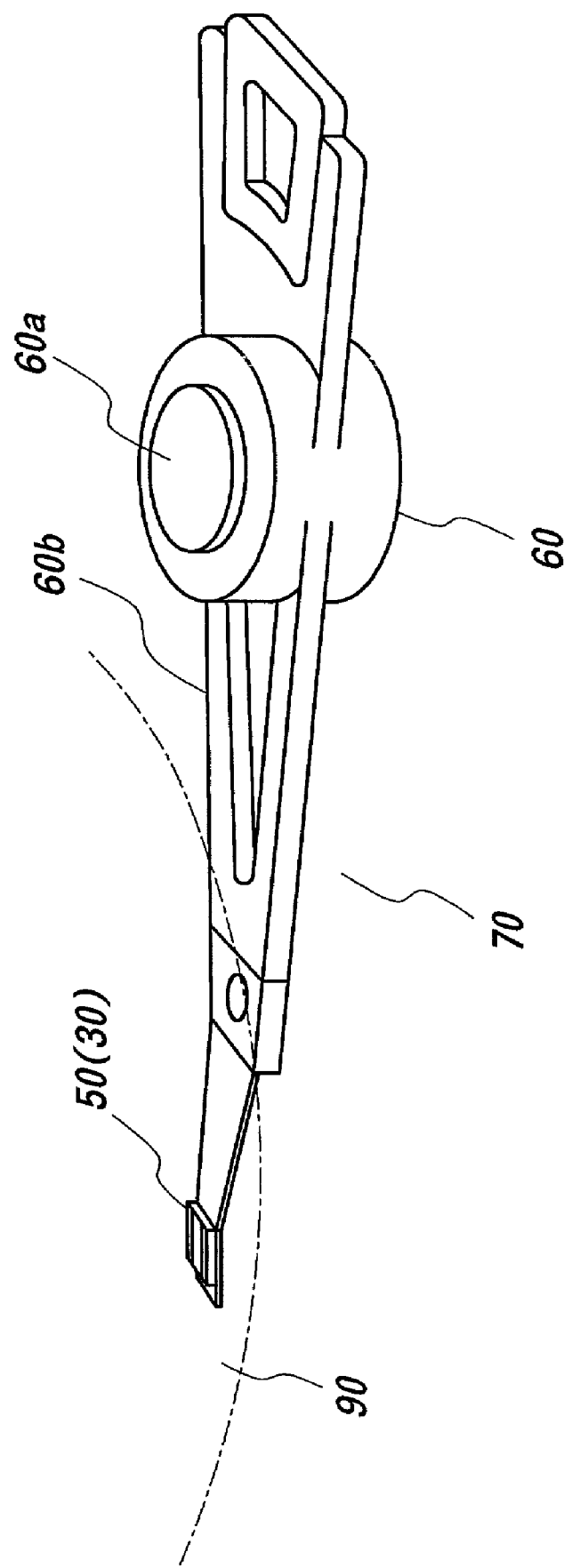
FIG. 1 is a structural view showing a head gimbal assembly on which a thin film magnetic head according to the present invention is mounted.

This invention will be described in detail, with reference to the drawings, hereinafter. Like reference numerals designate like or corresponding constituent elements throughout the several views, and detail explanation for the like or corresponding constituent elements is omitted.

First Embodiment

Figure 2:
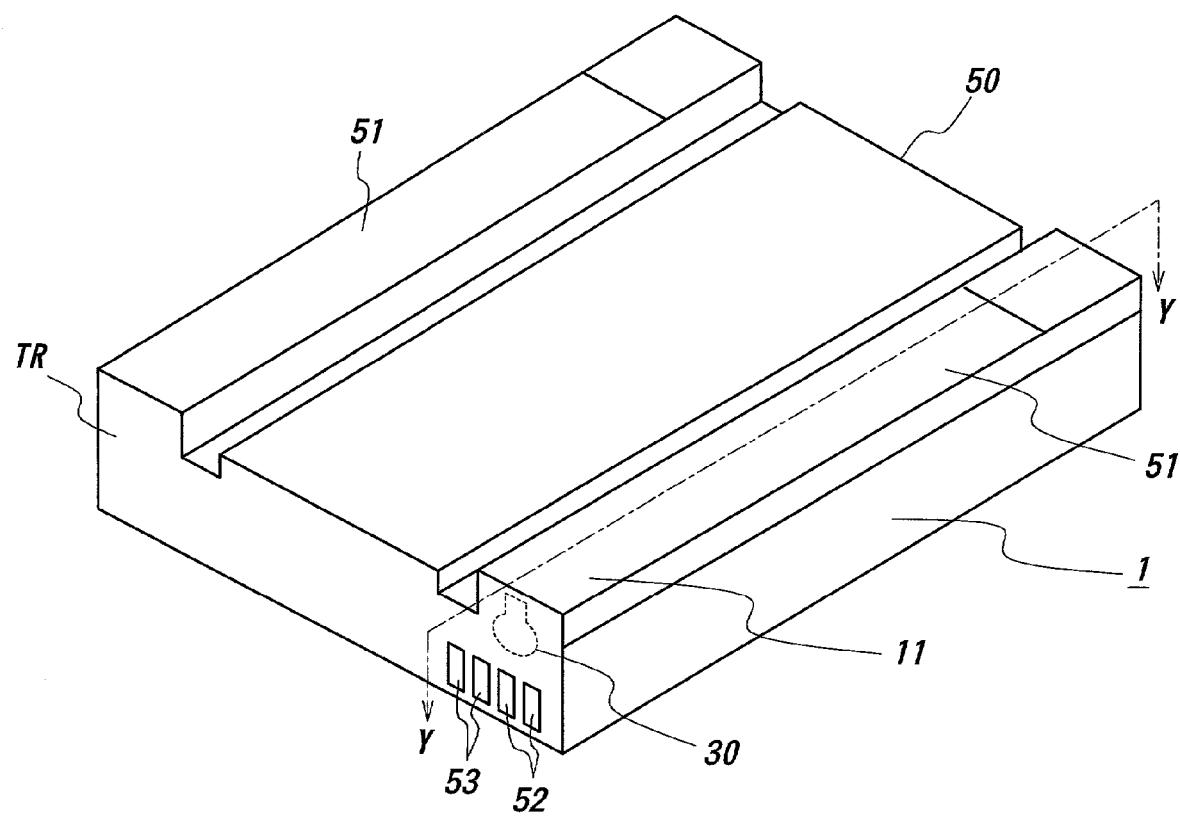
FIG. 2 is a structural view showing a slider including the thin film magnetic head shown in FIG. 1.
Figure 3:
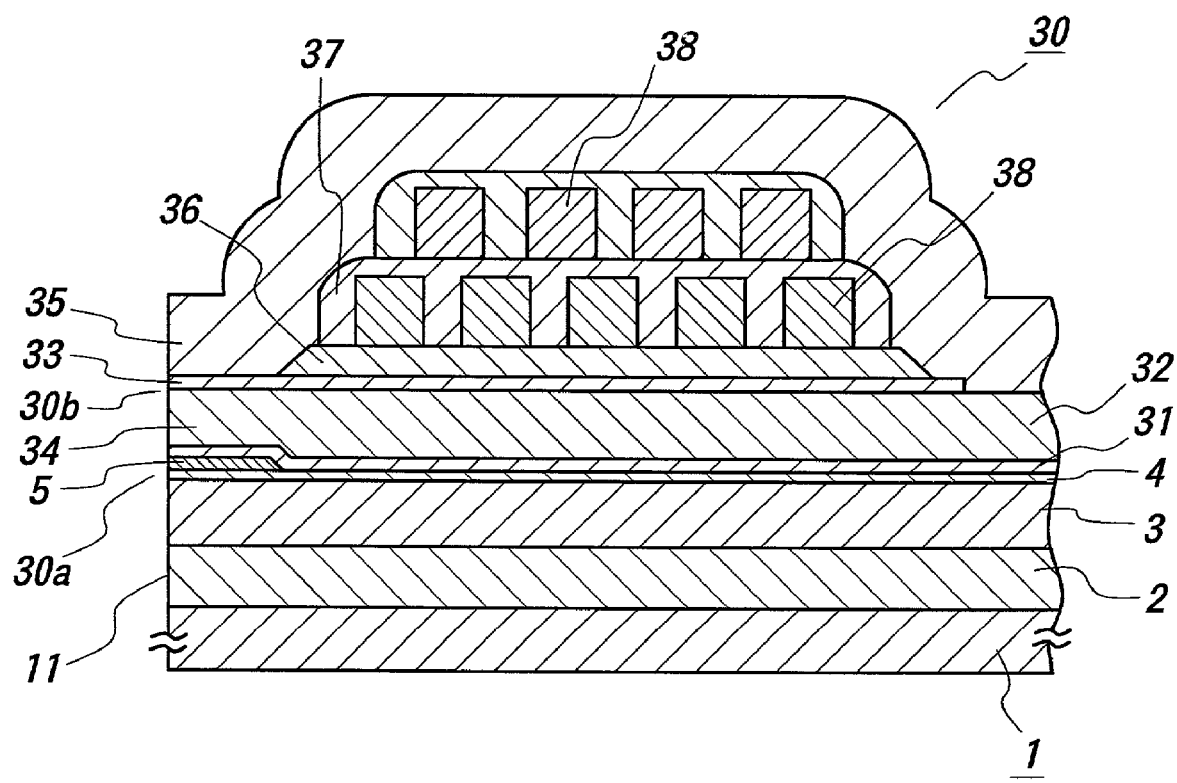
FIG. 3 is a cross sectional view showing the thin film magnetic head shown in FIG. 2, taken on line Y-Y.

First of all, a head gimbal assembly as a magnetic head device according to the present invention and a thin film magnetic head including a recording head and reproducing head which is mounted on the head gimbal assembly, with reference to FIGS. 1-3.

FIG. 1 is a structural view showing a head gimbal assembly 70 on which a thin film magnetic head 30 is mounted. The head gimbal assembly 70 includes an actuator arm 60 which is joined with a magnetic disk drive device (not shown). The actuator arm 60 includes a shaft 60a and an arm 60b which is supported by the shaft 60a so that the arm 60b can be rotated around the shaft 60a. The thin film magnetic head 30 is fabricated on a given slider 50, which is provided on the arm 60b and opposed to a magnetic recording medium 90 depicted by the dashed line. The arm 60b is so constructed as to be rotated by a voice coil motor (not shown), and thus, the slider 50 is moved in the radius direction of the magnetic recording medium 90 across the track lines on the recording surface of the magnetic recording medium. With the slider 50 being moved, given information is recorded in and read out of the magnetic recording medium 90 along the track lines.

FIG. 2 is a structural view showing the slider 50 including the thin film magnetic head 30. The slider 50 includes a bulky base 1 made of AlTiC, etc. The base 1 has a hexahedral shape, and is disposed in the vicinity of the magnetic recording medium 90 so that one surface of the base 1 to constitute an ABS 11 is opposed to the magnetic recording medium 90. When the magnetic recording medium 90 is rotated, a given airflow is generated in between the recording surface of the magnetic recording medium 90 and the ABS 11, so the slider 50 is floated and held by a minute distance by the airflow.

The slider 50 has rails 51 on the ABS to control the airflow in between the magnetic recording medium and the slider 50. The slider 50 does not always have the two rails 51, and may have one to three rails. Moreover, the slider 51 may have a flat surface having no rail. For improving its floating characteristic, the ABS of the slider may have various geometrical shapes. This invention can be applied for any types of slider.

The slider 50 may have protective films, made of DLC or the like, having a thickness of 8-10 nm on the rails. In this case, the surfaces of the protective films correspond to the ABS.

The thin film magnetic head 30 including the recording head and the reproducing head is provided at the trailing edge TR of the base 1 which is side surface of the base 1. On the trailing edge TR are provided electrodes 52, 52 for reproduction and electrodes 53, 53 for recording which are connected to the reproducing head and the recording head of the thin film magnetic head 30, respectively.

FIG. 3 is a cross sectional view showing the thin film magnetic head shown in FIG. 2, taken on line Y-Y along the center line of the thin film magnetic head. The thin film magnetic head 30 is composed of a reproducing head section 30a to reproduce information magnetically recorded in the magnetic recording medium 90 and a recording head section to magnetically record information in the magnetic recording medium 90 along the track lines which is constructed of a magnetoresistive effective type element according to the present invention.

As shown in FIG. 3, the reproducing head section 30a includes an insulating base protective layer 2, a bottom shielding layer 3, a bottom insulating layer 4 which are stacked in turn on the trailing edge TR of the base 1. The base protective layer is formed from alumina ($Al_2O_3$) in a thickness of 2-10 μm. The bottom shielding layer 3 is formed from a magnetic material such as NiFe alloy (permalloy) in a thickness of 1-3 μm. The bottom insulating layer is formed from $Al_2O_3$ or AlN in a thickness of 10-100 nm.

A magnetoresistive effective film 5 is formed on the bottom insulating layer 4. The reproducing head section 30a is so constructed as to read out information magnetically recorded in the magnetic recording medium 90 by utilizing the change in electric resistance depending on the magnetic field signal from the magnetic recording medium 90. On the magnetoresistive effective film 5 are provided a top insulating layer 31 to shut off leak current and a top shielding layer 32 to shut off leak magnetic flux.

The recording head section 30b is fabricated on the top insulating layer 31, and includes a write gap layer 33, a top magnetic pole portion 35 formed via photoresist layers 36 and 37 and a thin film coil 38 embedded in the photoresist layer 37. Therefore, the reproducing head section 30a and the recording head section 30b are combined and unified. The write gap layer 33 is formed in a thickness of 0.1-0.5 μm from an insulating material such as $Al_2O_3$. The photoresist layer 36 is formed in a thickness of 1-5 μm. The thin film coil 38 is formed in a thickness of 1-3 μm. The stacking number of the thin film coil is not limited, but single layered thin film coil or three layered thin film coil may be employed, as well as the two layered thin film coil illustrated in FIG. 3. The thin film coil is covered with the photoresist layer 37.

A top magnetic pole portion 35 is formed on the write gap layer 33 and the photoresist layer 36 and 37 from a magnetic material having a large saturated magnetic flux density such as NiFe or FeN. The top magnetic pole portion 35 is contacted and magnetically joined with the top shielding layer 32 at the rear end thereof. Therefore, the top shielding layer 32 functions as a bottom magnetic pole portion 34 of the recording head section 30b.

Not shown in FIG. 3, on the top magnetic pole portion 35 is formed an overcoat layer in a thickness of 20-30 μm from $Al_2O_3$. With the recording head section 30b, the magnetic recording medium 90 is magnetized by means of a given magnetic flux generated at the write gap layer 33 located between the bottom magnetic pole portion 34 and the top magnetic pole portion 35 by flowing a given current in the thin film coil 38. As a result, information is recorded depending on the magnetization directions of the magnetic recording medium 90.

Figure 4:
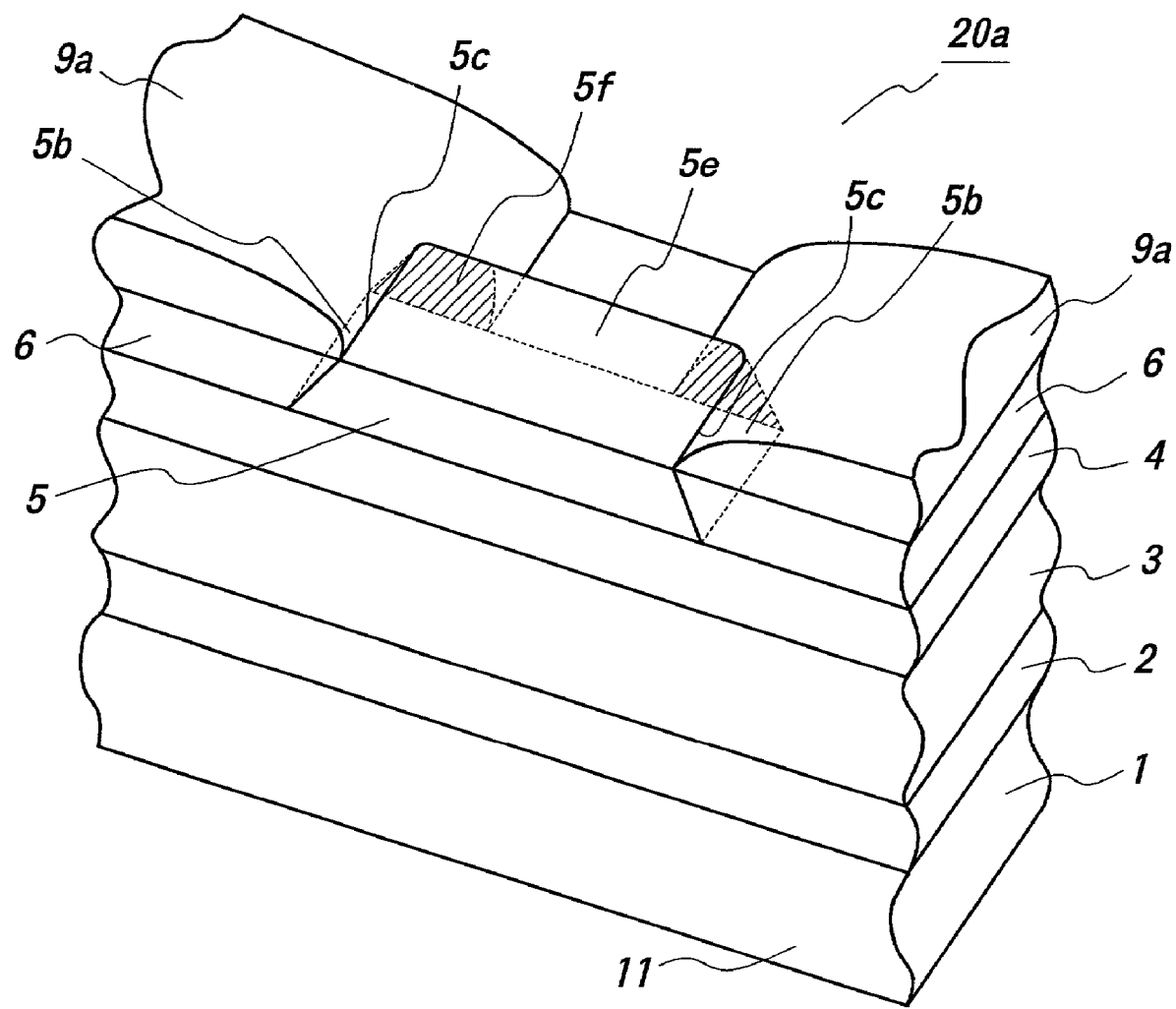
FIG. 4 is a perspective view showing a magnetoresistive effective type element constructing the thin film magnetic head shown in FIGS. 2 and 3.
Figure 5:
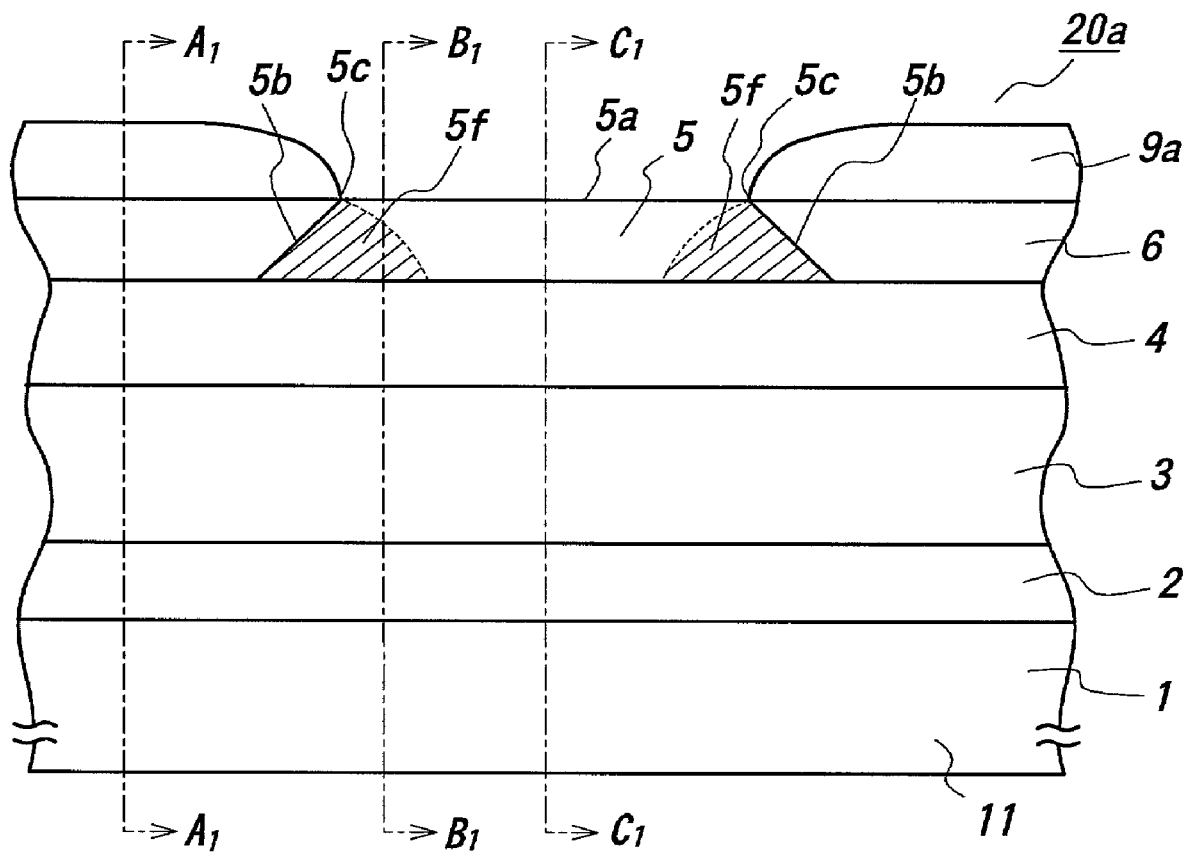
FIG. 5 is an elevational view showing the magnetoresistive effective type element shown in FIG. 4, as viewed from the ABS side.
Figure 6:
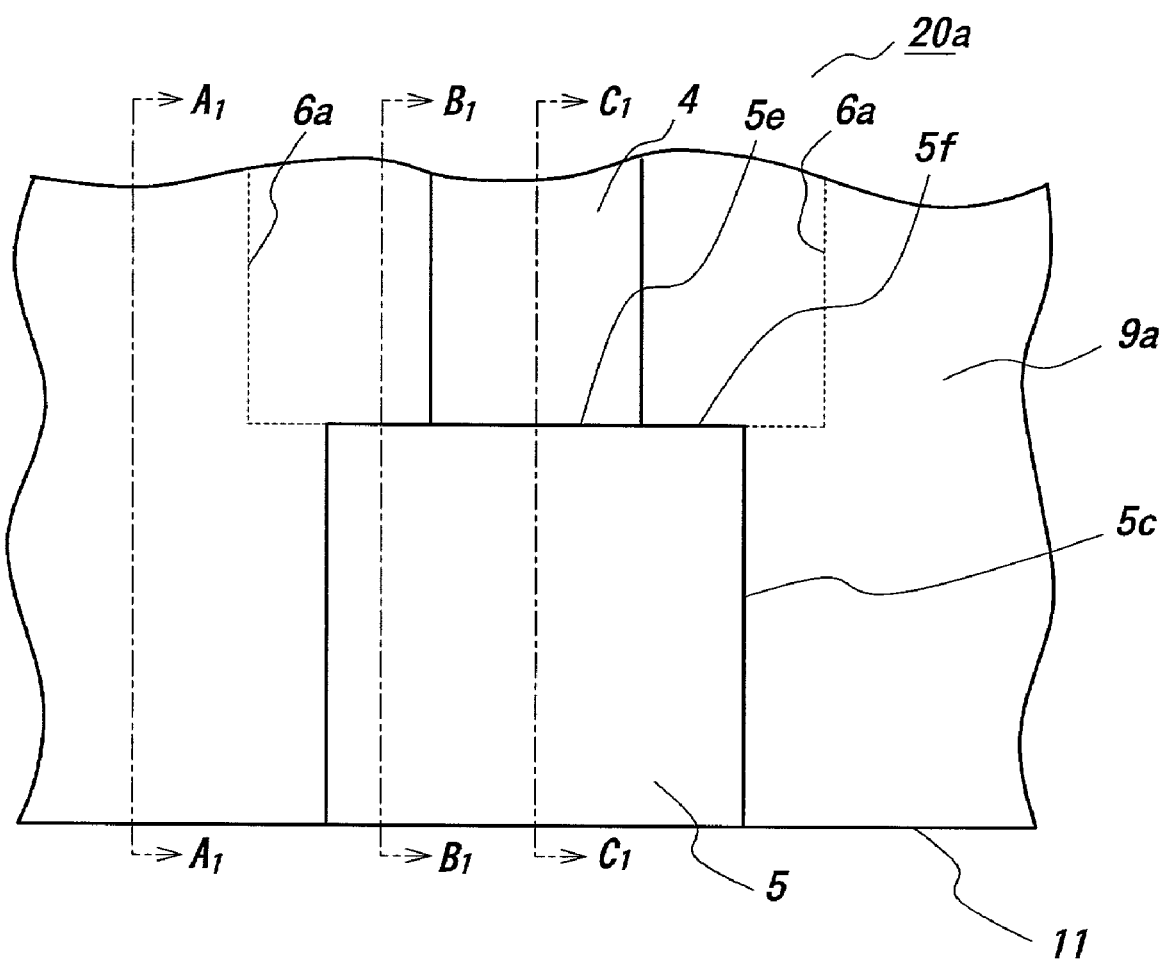
FIG. 6 is a plan view showing the magnetoresistive effective type element shown in FIG. 4, as viewed from the upper side of the magnetoresistive effective film.
Figure 7:
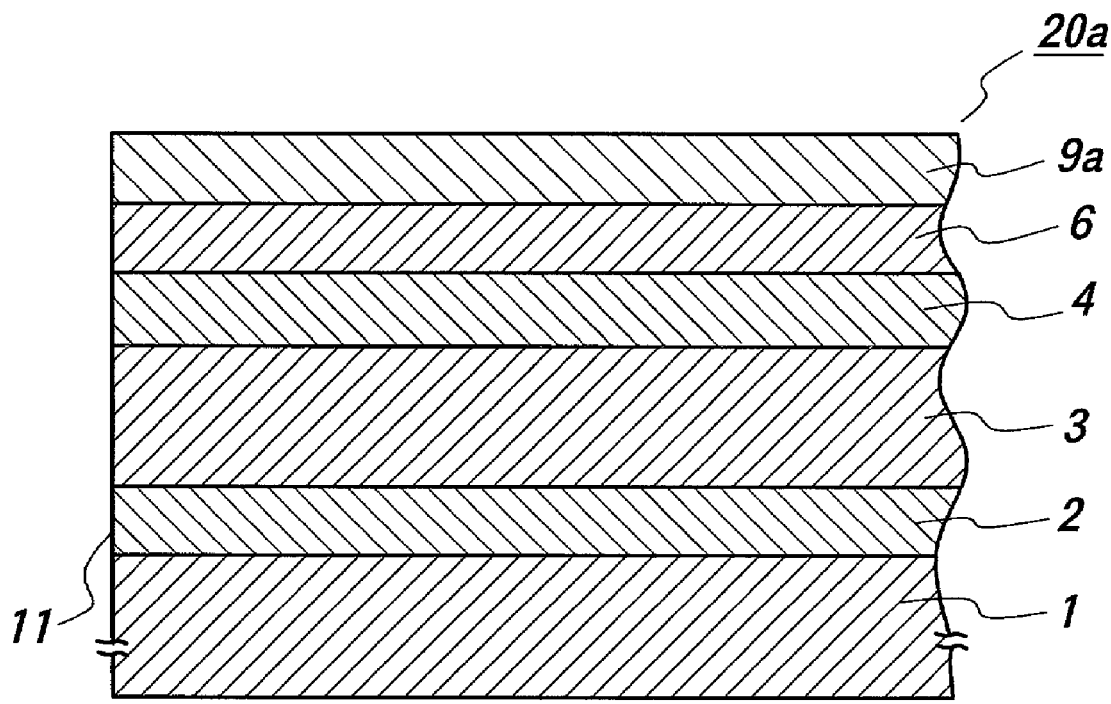
FIG. 7 is a cross sectional view showing the magnetoresistive effective type element shown in FIGS. 5 and 6, taken on line A1-A1.
Figure 8:
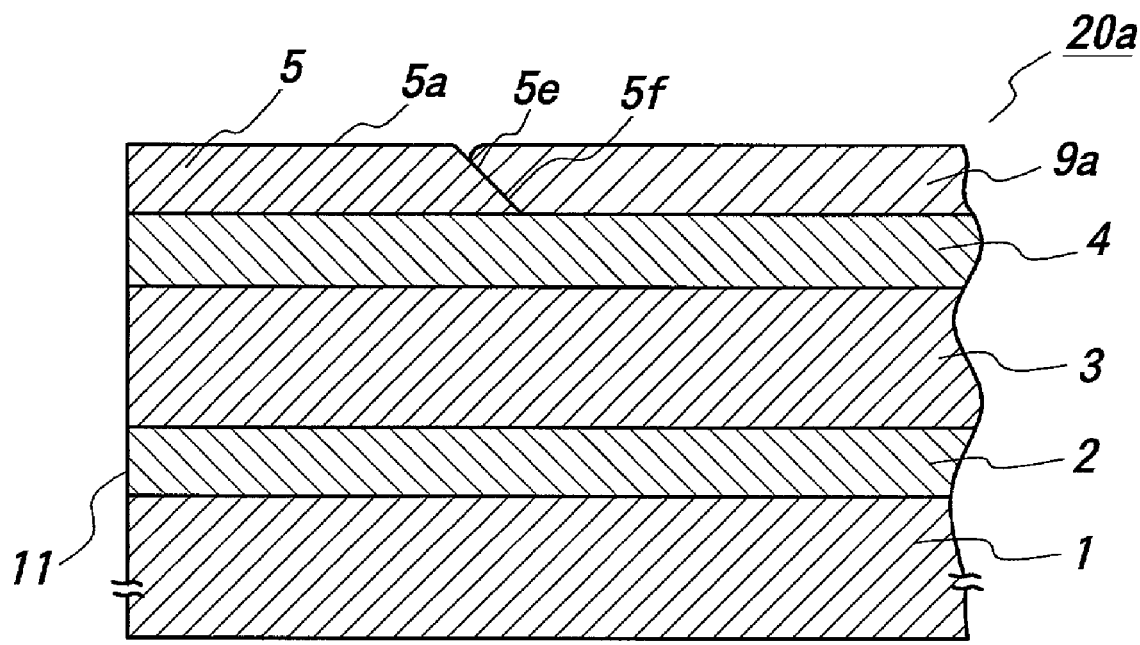
FIG. 8 is a cross sectional view showing the magnetoresistive effective type element shown in FIGS. 5 and 6, taken on line B1-B1.
Figure 9:
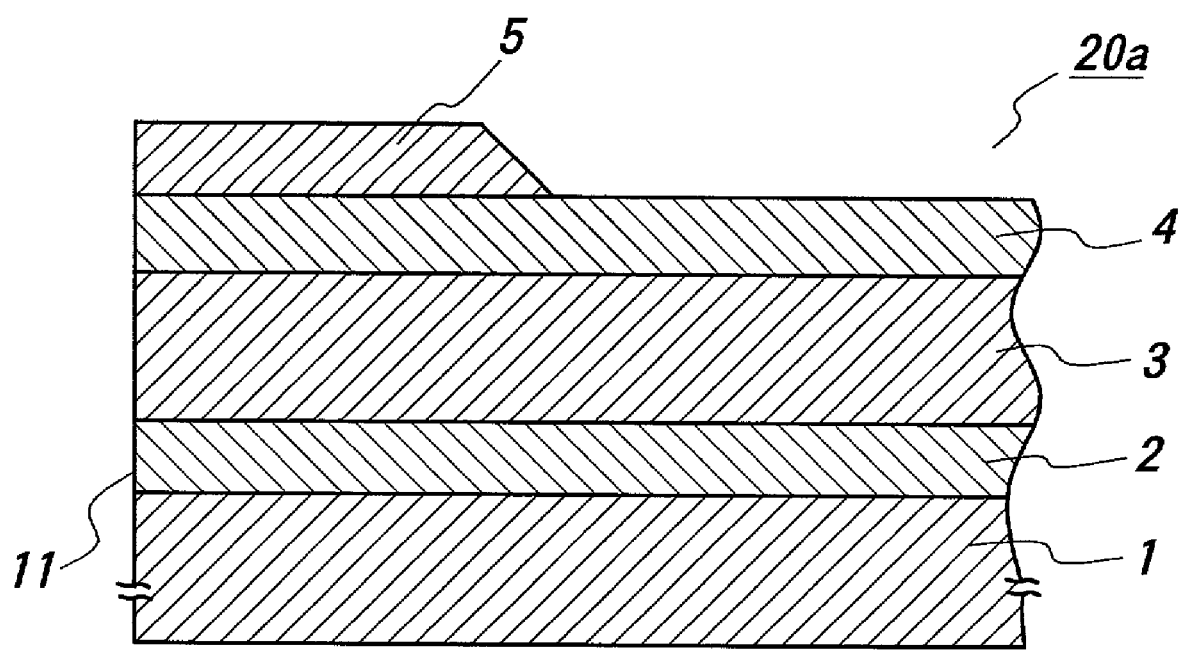
FIG. 9 is a cross sectional view showing the magnetoresistive effective type element shown in FIGS. 5 and 6, taken on line C1-C1.

FIG. 4 is a perspective view showing a magnetoresistive effective type element constructing the thin film magnetic head shown in FIGS. 2 and 3. FIG. 5 is an elevational view showing the magnetoresistive effective type element shown in FIG. 4, as viewed from the ABS side. FIG. 6 is a plan view showing the magnetoresistive effective type element shown in FIG. 4, as viewed from the upper side of the magnetoresistive effective film. FIGS. 7-9 are cross sectional views showing the magnetoresistive effective type element, taken on lines A1-A1, B1-B1 and C1-C1, respectively.

As is apparent from FIGS. 4 and 5, a magnetoresistive effective type element 20a includes a base protective layer 2, a bottom shielding layer 3 and a bottom insulating layer 4 which are stacked in turn on a base 1 made of AlTiC, as well as the conventional magnetoresistive effective type element 10a shown in FIG. 1. Then, a magnetoresistive effective film 5 is formed on the bottom insulating layer 4 so as to have an ABS opposite to a given magnetic recording medium, a top surface 5a, side surfaces 5b, 5b continued from the top surface 5a, and a rear surface 5e opposite to the ABS surface and continued from the side surfaces 5b. Then, magnetic biasing layers 6, 6 are formed so as to be adjacent to the side surfaces 5b, 5b of the magnetoresistive effective film 6. In FIG. 6, reference numeral "6a" designates boundaries of the magnetic biasing layers 6, 6, and as is apparent from FIG. 6, the magnetic biasing layers 6, 6 are elongated to the opposite side of the ABS along the side surfaces 5b, 5b of the magnetoresistive effective film 5. The magnetic biasing layers 6b, 6b are separated from one another at the rear side by a larger distance than the width of the magnetoresistive effective film 5.

With the above-mentioned magnetoresistive effective type element structure, the magnetic biasing layers 6, 6 are located in the bottom insulating layer 4 and electrode layer 9a in FIG. 7 which is a cross sectional view of the magnetoresistive effective type element shown in FIGS. 5 and 6, taken on line A1-A1 beyond the magnetoresistive effective film 5.

As is apparent from FIGS. 4-6, the electrode layers 9a, 9a are formed on the magnetic biasing layers 6, 6, respectively, in the vicinity of the side surfaces 5b, 5b of the magnetoresistive effective film 5. The electrode layers 9a, 9a are elongated from both sides to the center of the rear surface 5e of the magnetoresistive effective film 5 along the rear surface 5e thereof. Therefore, the electrode layers 9a, 9a are contacted with the area 5f depicted by the slanted lines. With the magnetoresistive effective type element structure, the electrode layers 9a, 9a are located at the rear side continued from the rear surface 5e of the magnetoresistive effective film 5 on the bottom insulating layer 4 in FIG. 8 which is a cross sectional view of the magnetoresistive effective type element shown in FIGS. 5 and 6, taken on line B1-B1 along the center line thereof perpendicularly across the ABS 11 thereof.

Then, as shown in FIGS. 4-6, the electrode layers 9a, 9a are separated from one another by a given distance. With the magnetoresistive effective type element structure, the electrode layers 9a, 9a are not located at the opposite side of the magnetoresistive effective film 5 to the ABS 11 in FIG. 9 which is a cross sectional view of the magnetoresistive effective type element shown in FIGS. 5 and 6, taken on line C1-C1 along the center line thereof perpendicularly across the ABS 11 thereof. At the rear side of the magnetoresistive effective film 5 in FIG. 9 is provided an insulating layer (not shown). Not shown in FIGS. 4-9, a top insulating layer 31 and a top shielding layer 32 are formed in turn on the magnetoresistive effective film 5 and the electrode layers 9a, 9a.

As a result, in the magnetoresistive effective type element 20a according to the present invention, the electrode layers 9a, 9a are electrically connected to the rear surface 5e at the area 5f thereof of the magnetoresistive effective film 5, so a given sense current is supplied to the magnetoresistive effective film 5 via the side surfaces 5b, 5b thereof and the rear contacting area 5f. Comparing with the conventional magnetoresistive effective type element 10a shown in FIG. 1, therefore, the electric contact area between the electrode layers 9a, 9a and the magnetoresistive effective film 5 of the magnetoresistive effective type element 20 is increased, and thus, the electric resistance thereof can be reduced. As a result, the heat generation at the electric contact area can be repressed. Moreover, the electric resistance between the reading terminals for the magnetoresistive effective type element 20a can be reduced, and thus, the design margin of the electric circuit including am amplifier to process information read can be enhanced.

Furthermore, the difference between the optical track width and the magnetic track width of the magnetoresistive effective type element 20a can be decreased, so that the effective track width can be maintained, and information can be read out and output as designed.

Second Embodiment

Figure 10:
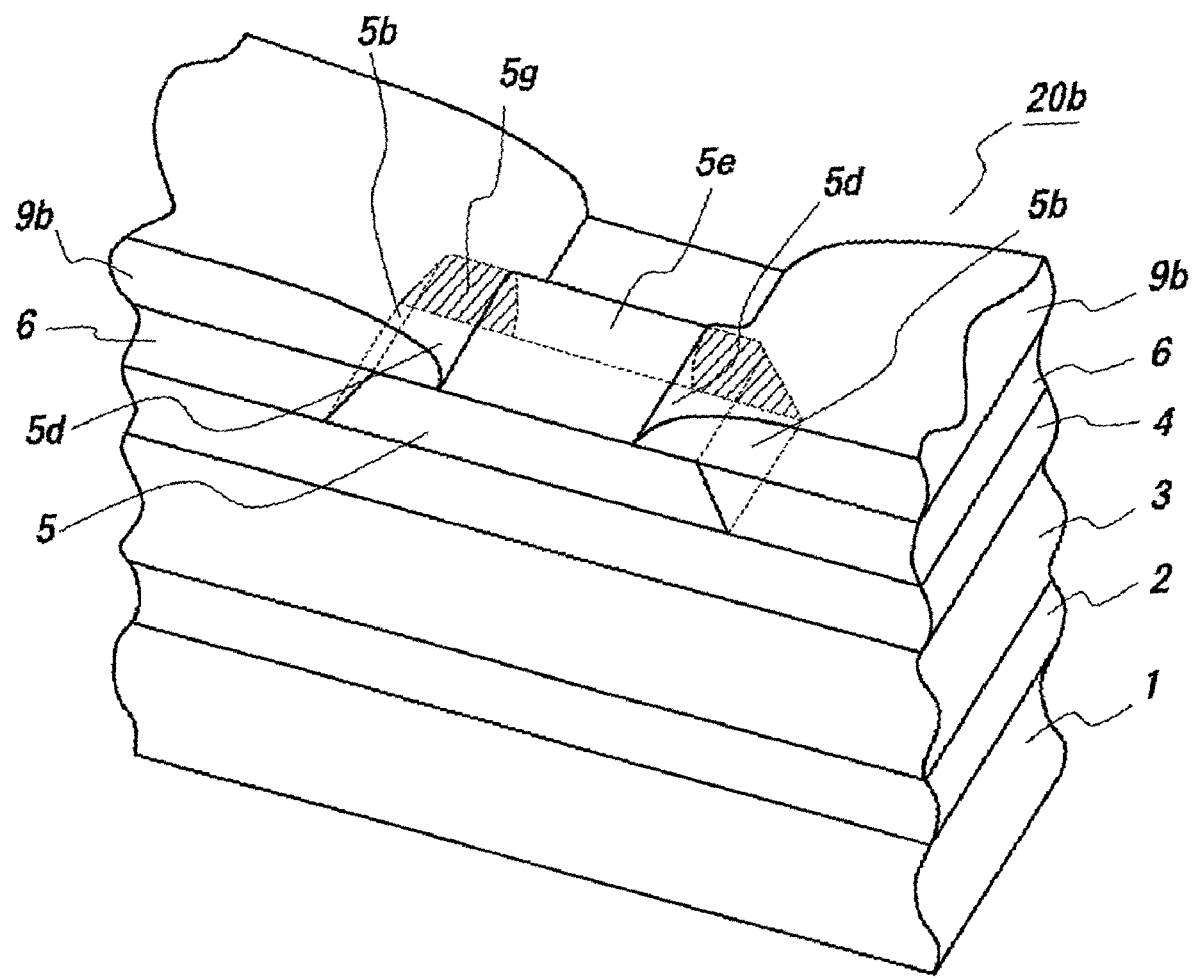
FIG. 10 is a perspective view showing another magnetoresistive effective type element constructing the thin film magnetic head shown in FIGS. 2 and 3.
Figure 11:
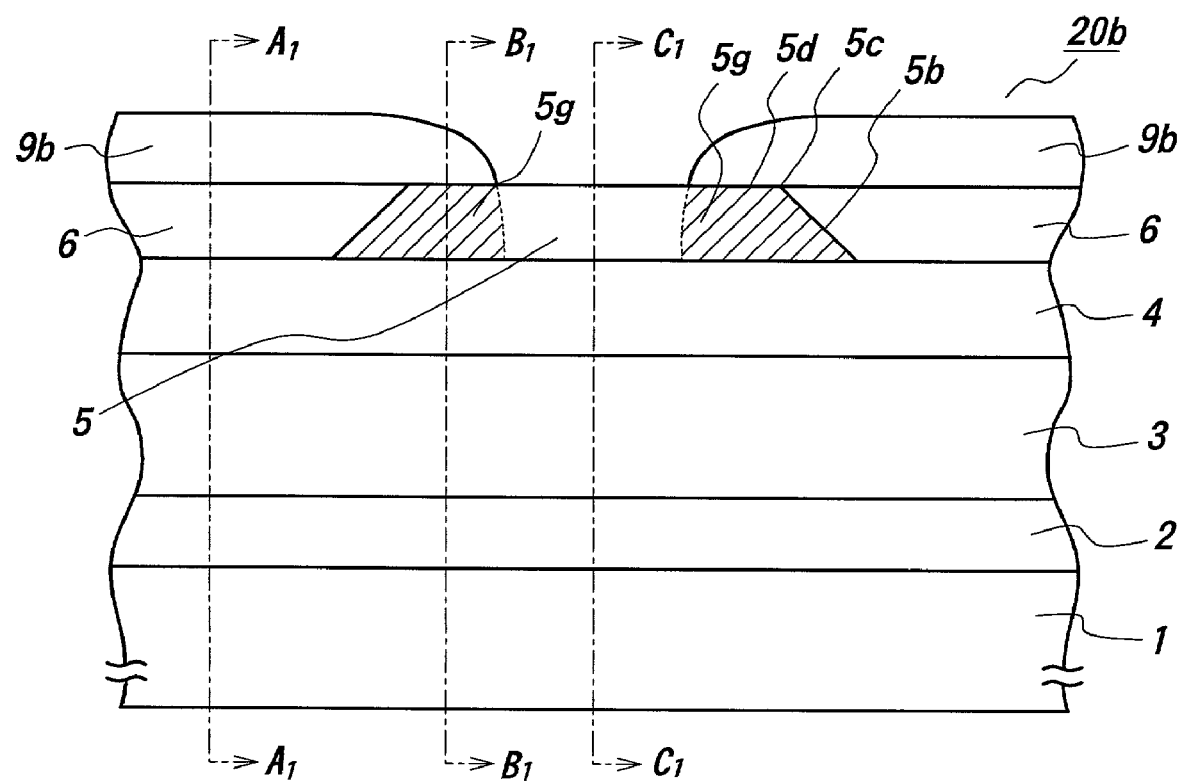
FIG. 11 is an elevational view showing the magnetoresistive effective type element shown in FIG. 10, as viewed from the ABS side.
Figure 12:
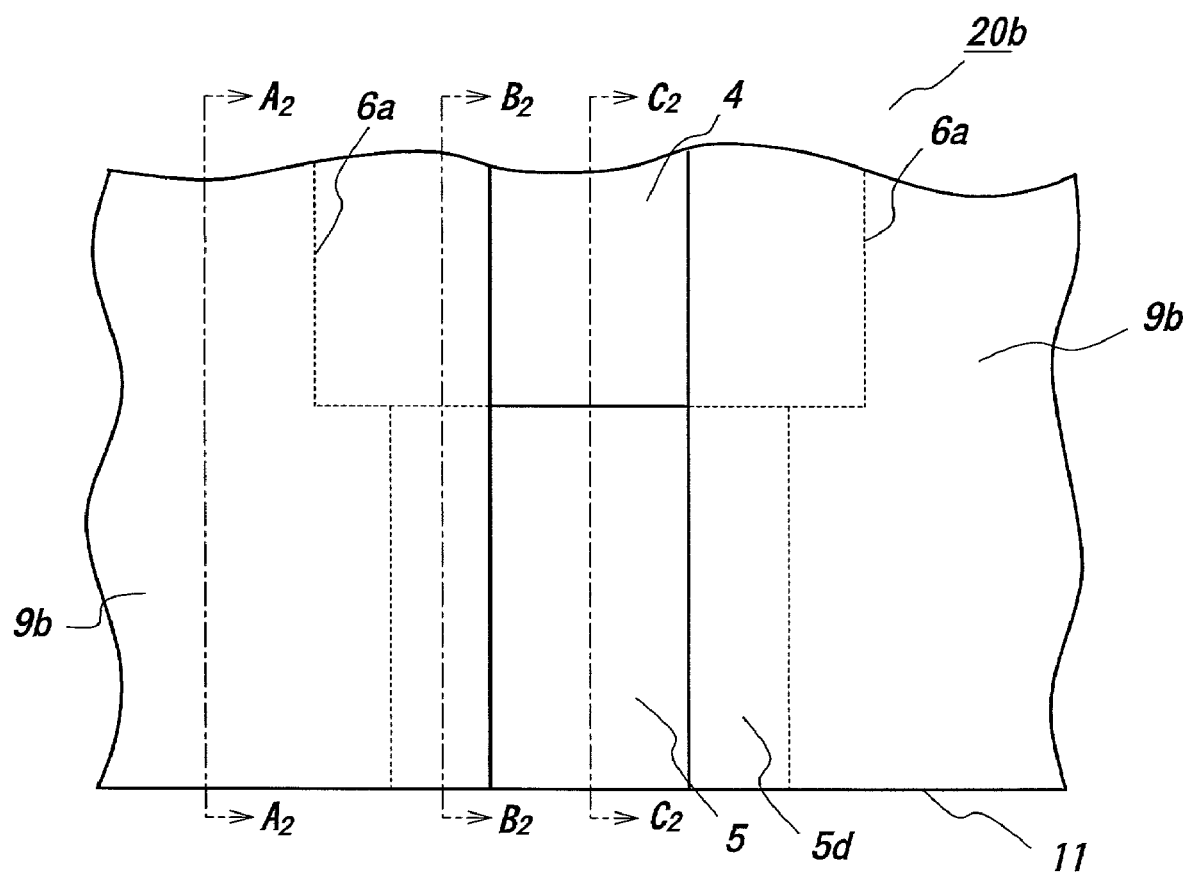
FIG. 12 is a plan view showing the magnetoresistive effective type element shown in FIG. 10, as viewed from the upper side of the magnetoresistive effective film.
Figure 13:
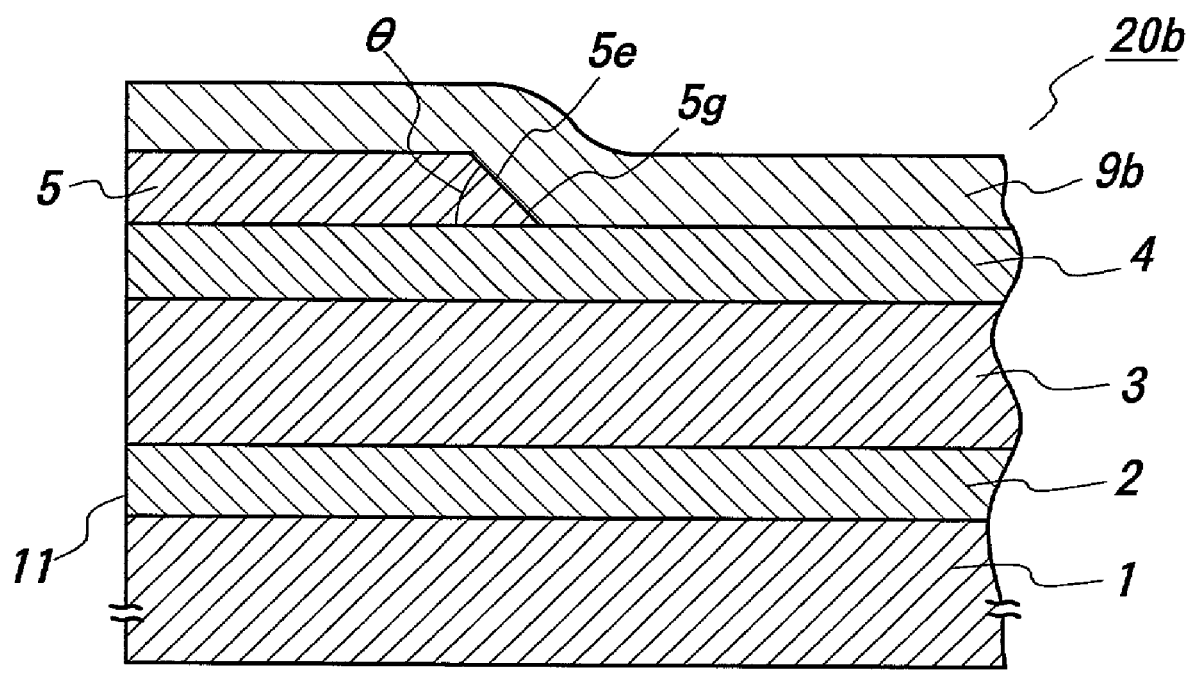
FIG. 13 is a cross sectional view showing the magnetoresistive effective type element shown in FIGS. 11 and 12, taken on line B2-B2.

FIG. 10 is a perspective view showing another magnetoresistive effective type element 20b in a second embodiment. FIG. 11 is an elevational view showing the magnetoresistive effective type element 20b shown in FIG. 10, as viewed from the ABS side, and FIG. 12 is a plan view showing the magnetoresistive effective type element 20b shown in FIG. 10, as viewed from the upper side of the magnetoresistive effective film. FIG. 13 is a cross sectional view showing the magnetoresistive effective type element 20b shown in FIGS. 11 and 12, taken on line B2-B2. Herein, a reproducing head section including the magnetoresistive effective type element 20 may be so constructed as the reproducing head section 30a in the first embodiment, and a thin film magnetic head may be so constructed as including the reproducing head section and a given recording head section as shown in the first embodiment. Also, a head gimbal assembly including the thin film magnetic head may be so constructed as the first embodiment.

Figure 32:
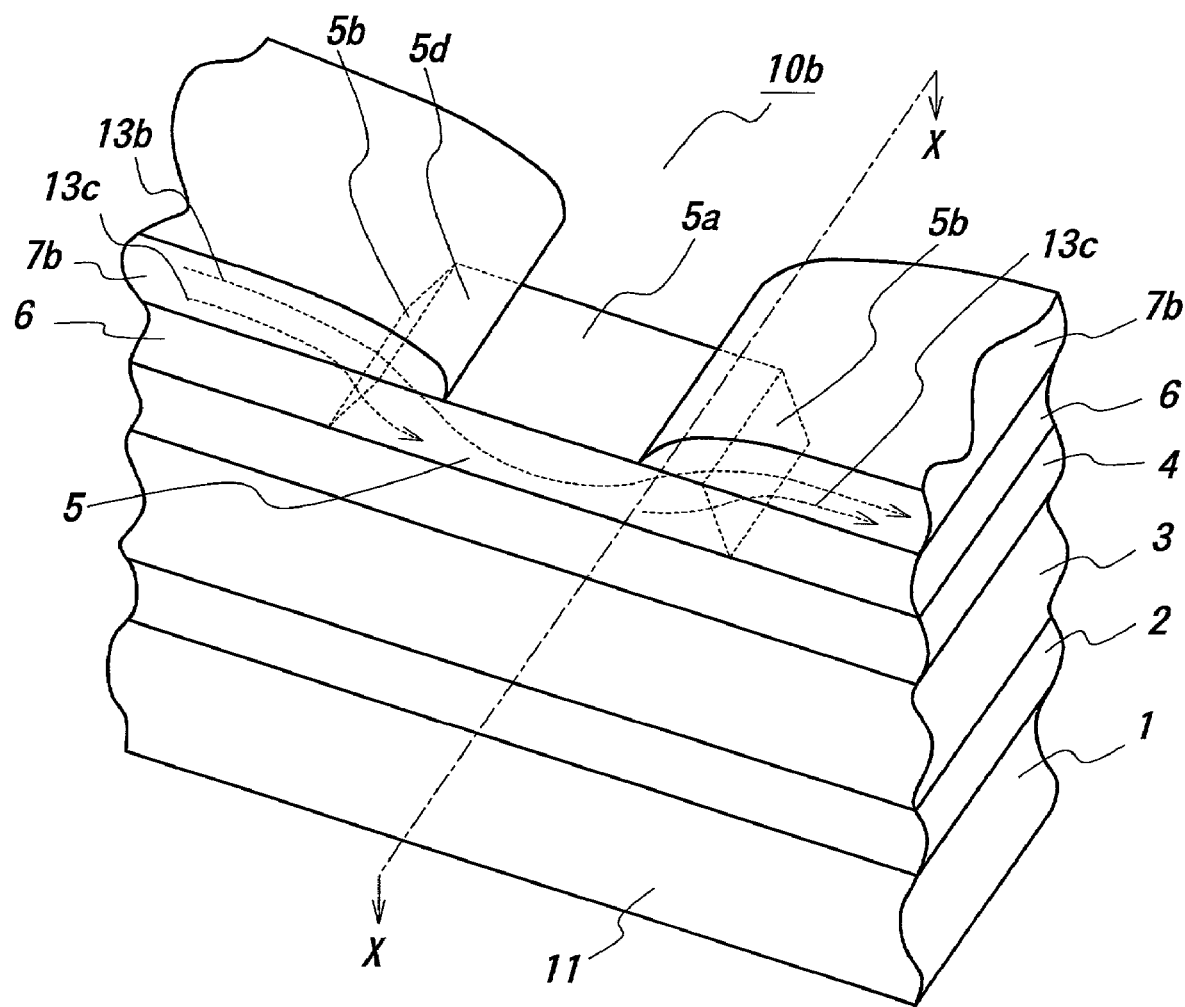
FIG. 32 is a perspective view showing another conventional magnetoresistive effective type element.
Figure 33:
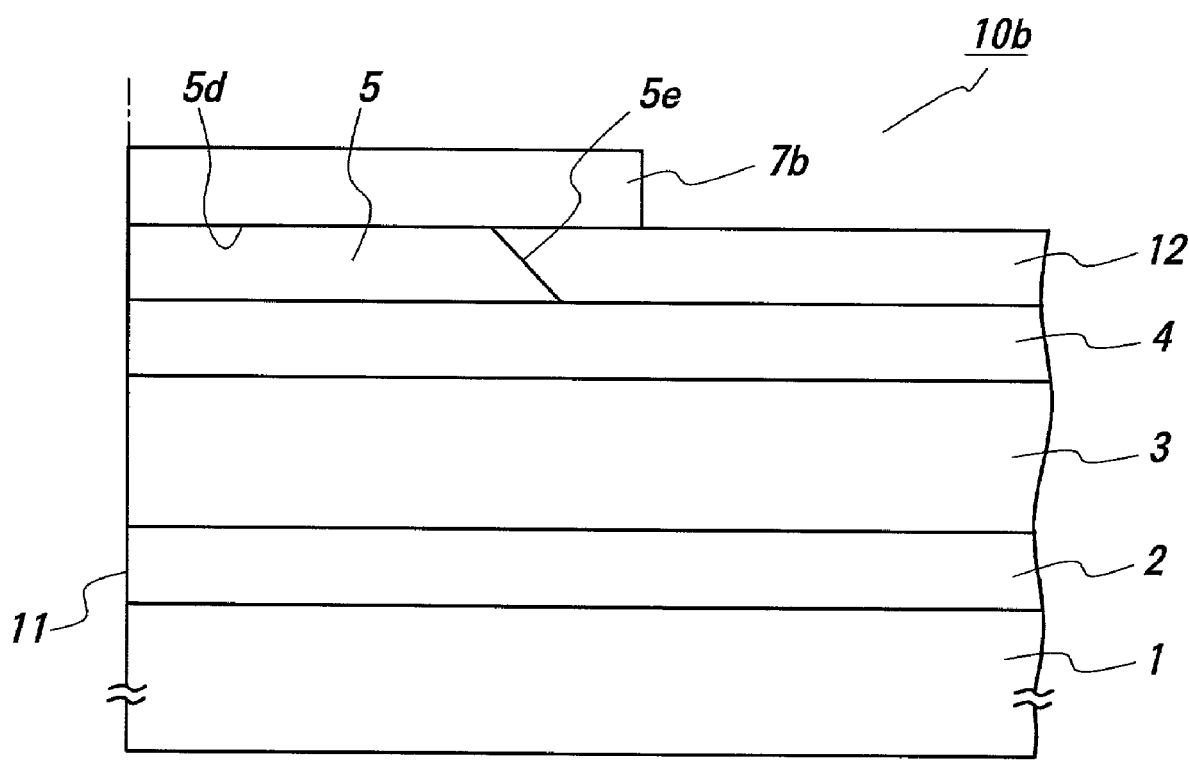
FIG. 33 is a cross sectional view showing the magnetoresistive effective type element shown in FIG. 32, taken on line X-X.

As shown in FIGS. 10 and 11, the magnetoresistive effective type element 20b includes a base made of AlTiC or the like, a base protective layer 2, a bottom shielding film 3, a bottom insulating layer 4, a magnetoresistive effective film 5, a magnetic biasing layers 6, 6 and electrode layers 9b, 9b which are formed on the base 1, as well as the conventional magnetoresistive effective type element 10b shown in FIG. 32. The magnetic biasing layers 6, 6 are located between the bottom insulating layer 4 and electrode layers 9b, 9b beyond the magnetoresistive effective film 5. Therefore, the cross section of the magnetoresistive effective type element 20b taken on line A2-A2 is similar to the one of the magnetoresistive effective type element 20a as shown in FIG. 7, and so is not illustrated in the second embodiment.

As is apparent from FIGS. 10-12, the electrode layers 9b, 9b are so formed on the magnetic biasing layers 6, 6 as to cover the edge portions 5d of the top surface 5a of the magnetoresistive effective film 5 in the vicinity of the side surfaces 5b of the magnetoresistive effective film 5. Then, the electrode layers 9b, 9b are so formed as to be contacted with at least one portion of the rear surface 5e opposite to the ABS 11 of the magnetoresistive effective film 5 and to be elongated backward from the rear surface 5e. The rear contacting area 5g of the rear surface 5e of the magnetoresistive effective film 5 is designated by the hatched line area. As shown in FIG. 13 which is a cross sectional view taken on line B2-B2, that is, perpendicular to the ABS 11 across the edge portions 5d and the rear contacting area 5g of the magnetoresistive effective film 5, the electrode layers 9b, 9b are formed on the magnetoresistive effective film 5 and the bottom insulating layer 4 so as to be contacted with the rear contacting area 5g of the magnetoresistive effective film 5.

The electrode layers 9b, 9b are separated from one another by a given distance as the first embodiment. In the cross section of the magnetoresistive effective type element 20b shown in FIGS. 11 and 12 taken on line C2-C2, therefore, the electrode layers 9b, 9b are not located at the opposite side of the magnetoresistive effective film 5 to the ABS 11, so a given insulating layer is located thereat as shown in FIG. 9 in the first embodiment. Not shown, a top insulating layer 31 and a top shielding layer 32 are formed in turn on the magnetoresistive effective film 5 and the electrode layers 9b, 9b.

As a result, in the magnetoresistive effective type element 20b according to the present invention, the electrode layers 9b, 9b are electrically connected to the rear surface 5e at the area 5g thereof of the magnetoresistive effective film 5, so a given sense current is supplied to the magnetoresistive effective film 5 via the edge portions 5d, 5d thereof and the rear contacting area 5g. Comparing with the conventional magnetoresistive effective type element 10b shown in FIG. 32, therefore, the electric contact area between the electrode layers 9b, 9b and the magnetoresistive effective film 5 of the magnetoresistive effective type element 20b is increased, and thus, the electric resistance thereof can be reduced. As a result, the heat generation at the electric contact area can be repressed. Moreover, the electric resistance between the reading terminals for the magnetoresistive effective type element 20b can be reduced, and thus, the design margin of the electric circuit including am amplifier to process information read can be enhanced.

When, in the conventional magnetoresistive effective type element 10b shown in FIG. 32, the width, length and thickness of the magnetoresistive effective film 5 is set to 0.3 µm, 0.2 µm and 0.04 µm, respectively, and the width of the contacting area of the electrode layers 7b, 7b to the edge portions 5d of the magnetoresistive effective film 5 is set to 0.05 µm, the contacting area between the magnetoresistive effective film 5 and the electrode layers 7b, 7b is about 0.020 µm$^2$ because the electrode layers 9b, 9b are not contacted with the rear surface 5e of the magnetoresistive effective film 5.

In contrast, in the magnetoresistive effective type element 20b shown in FIGS. 10-13, the contacting area between the electrode layers 9b, 9b to the magnetoresistive effective film 5 is about 0.026 µm$^2$ in the above condition if the rising angle θ of the rear surface 5e of the magnetoresistive effective film 5 is set to 45 degrees. Therefore, the contacting area of the magnetoresistive effective type element 20b is 1.3 times as large as the one of the conventional magnetoresistive effective type element 10b. It is turned out quantitatively, therefore, that the contacting area of the electrode layers 9b, 9b to the magnetoresistive effective film 5 is increased.

Third Embodiment

FIGS. 14-17 show a magnetoresistive effective type element 20*c* modified for the magnetoresistive effective type element 20*b* shown in FIGS. 10-13. Herein, a reproducing head section including the magnetoresistive effective type element 20 may be so constructed as the reproducing head section 30*a* in the first embodiment, and a thin film magnetic head may be so constructed as including the reproducing head section and a given recording head section as shown in the first embodiment. Also, a head gimbal assembly including the thin film magnetic head may be so constructed as the first embodiment.

Figure 14:
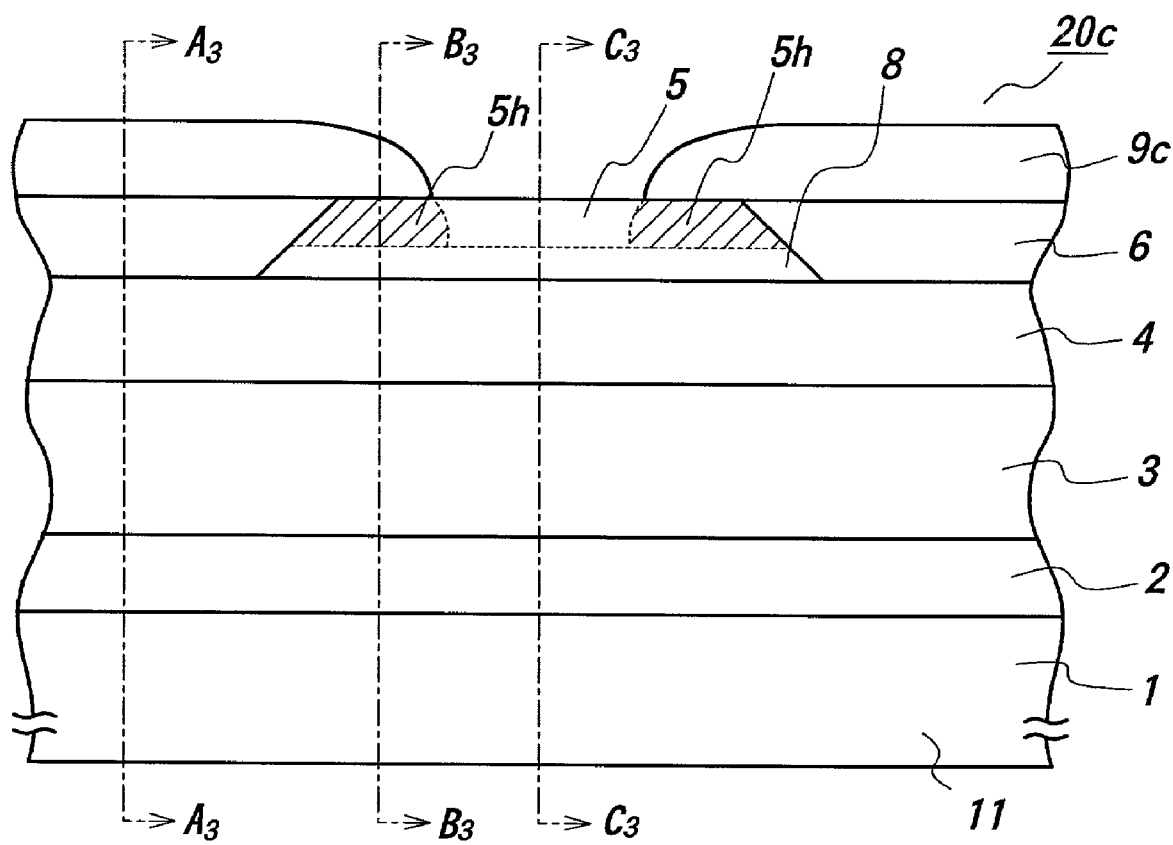
FIG. 14 is a modified embodiment of the magnetoresistive effective type element shown in FIGS. 10-13.
Figure 15:
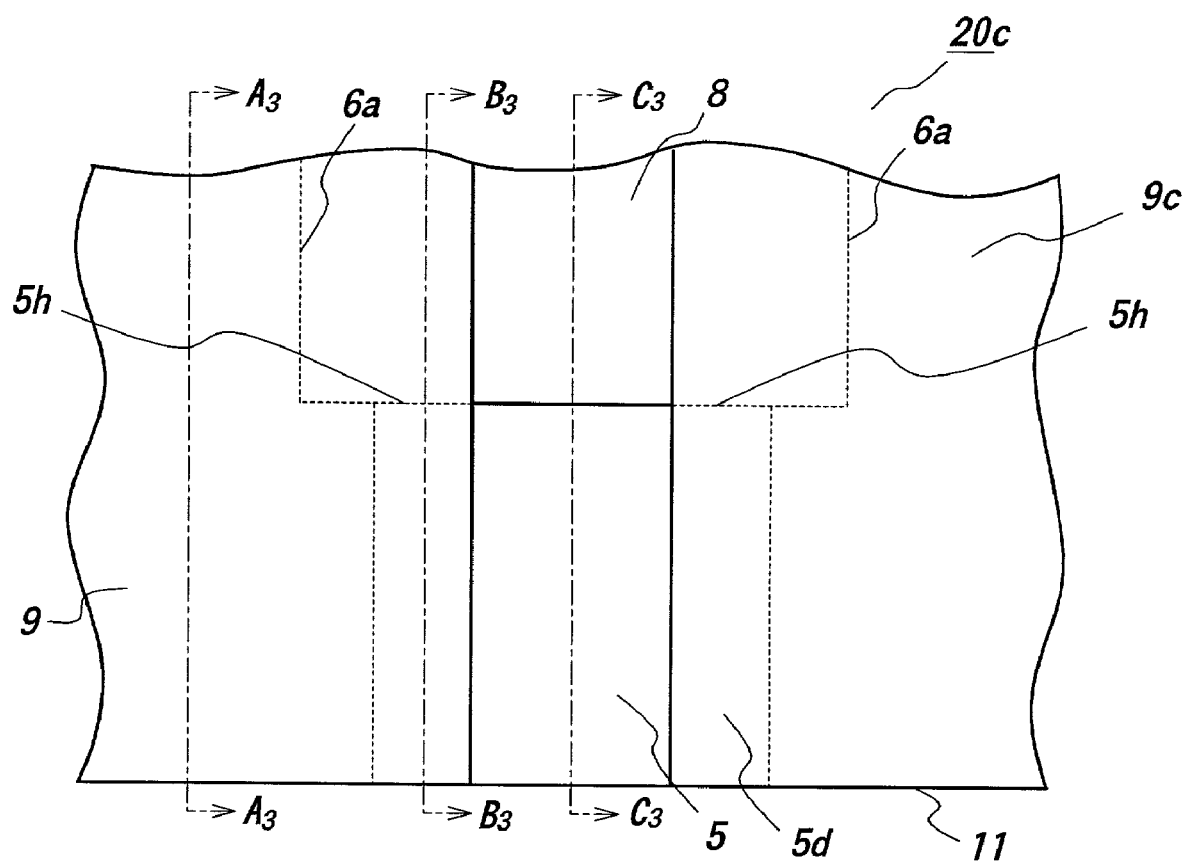
FIG. 15 is a plan view showing the magnetoresistive effective type element shown in FIG. 14, as viewed from the upper side of the magnetoresistive effective film.
Figure 16:
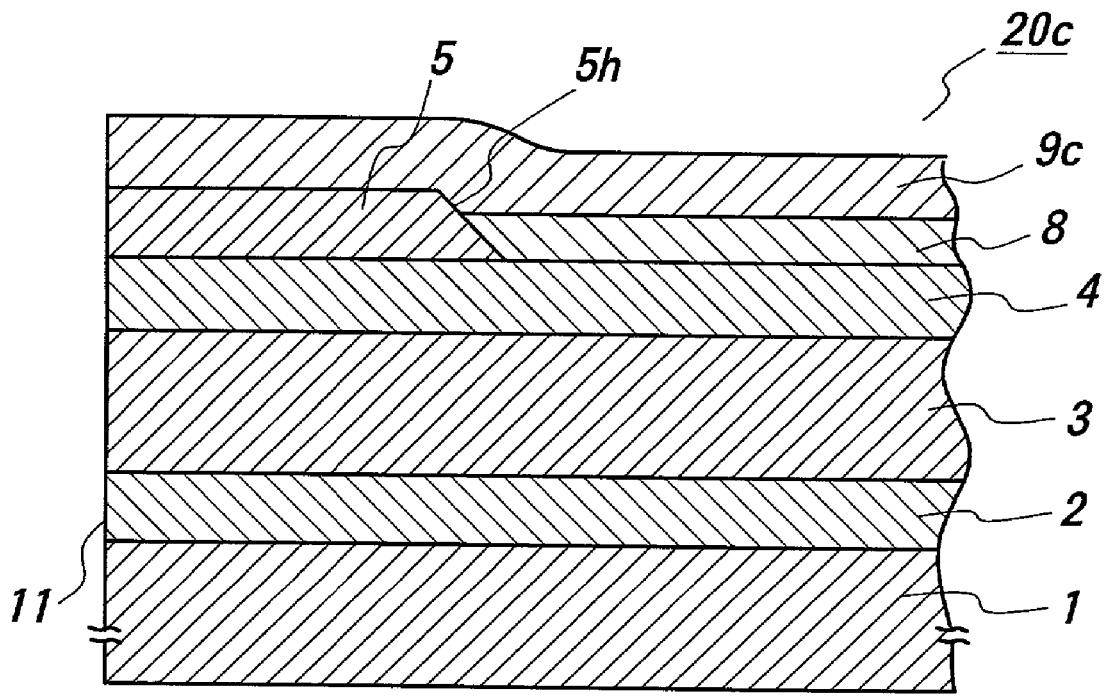
FIG. 16 is a cross sectional view showing the magnetoresistive effective type element shown in FIGS. 14 and 15, taken on line B3-B3.
Figure 17:
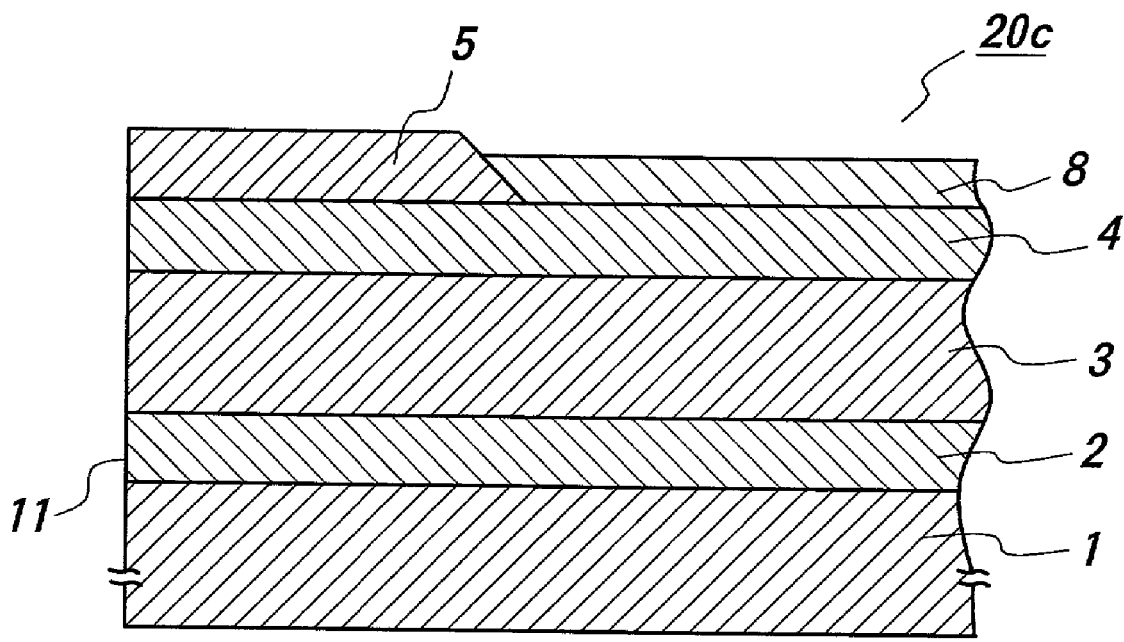
FIG. 17 is a cross sectional view showing the magnetoresistive effective type element shown in FIGS. 14 and 15, taken on line C3-C3.

FIG. 14 is an elevational view showing a magnetoresistive effective type element 20*c* in a third embodiment, as viewed from the ABS thereof. FIG. 15 is a plan view showing the magnetoresistive effective type element shown in FIG. 14, as viewed from the upper side of the magnetoresistive effective film. FIG. 16 is a cross sectional view showing the magnetoresistive effective type element shown in FIGS. 14 and 15, taken on line B3-B3, and FIG. 17 is a cross sectional view showing the magnetoresistive effective type element shown in FIGS. 14 and 15, taken on line C3-C3.

The magnetoresistive effective type element 20*c* includes a base 1 made of AlTiC or the like, a base protective layer 2, a bottom shielding film 3, a bottom insulating layer 4, a magnetoresistive effective film 5, a magnetic biasing layers 6, 6 and electrode layers 9*b*, 9*b* which are formed on the base 1, as well as the magnetoresistive effective type element 20*b* shown in the first embodiment. The magnetic biasing layers 6, 6 are located between the bottom insulating layer 4 and electrode layers 9*c*, 9*c* beyond the magnetoresistive effective film 5. Therefore, the cross section of the magnetoresistive effective type element 20*c* taken on line A3-A3 is similar to the one of the magnetoresistive effective type element 20*a* as shown in FIG. 7, and so is not illustrated in the third embodiment.

Also, in the magnetoresistive effective type element 20*c*, as shown in FIGS. 14 and 15, a planarizing film 8 made of Al$_2$O$_3$ or the like is formed so as to be contacted with the lower portion of the rear surface 5*e* of the magnetoresistive effective film 5.

As is apparent from FIGS. 14-16, the electrode layers 9*c*, 9*c* are so formed on the magnetic biasing layers 6, 6 as to cover the edge portions 5*d* of the top surface 5*a* of the magnetoresistive effective film 5 in the vicinity of the side surfaces 5*b* of the magnetoresistive effective film 5. Then, the electrode layers 9*c*, 9*c* are so formed as to be contacted with at least one portion of the rear surface 5*e* opposite to the ABS 11 of the magnetoresistive effective film 5 and to be elongated backward from the rear surface 5*e*. The rear contacting area 5*g* of the rear surface 5*e* of the magnetoresistive effective film 5 is designated by the hatched line area. As shown in FIG. 16 which is a cross sectional view taken on line B3-B3 in FIGS. 14 and 15, the electrode layers 9*c*, 9*c* are formed on the magnetoresistive effective film 5 and the planarizing film 8 so as to be contacted with the rear contacting area 5*h* located at the upper portion of the rear surface 5*e* of the magnetoresistive effective film 5.

The electrode layers 9*c*, 9*c* are separated from one another by a given distance as the first and the second embodiment. In the cross section of the magnetoresistive effective type element 20*c* shown in FIGS. 14 and 15 taken on line C2-C2, therefore, the electrode layers 9*c*, 9*c* are not located at the opposite side of the magnetoresistive effective film 5 to the ABS 11, so the planarizing film 8 is located thereat as shown in FIG. 17. Not shown, a top insulating layer 31 and a top shielding layer 32 are formed in turn on the magnetoresistive effective film 5 and the electrode layers 9*c*, 9*c* to provide a practical thin film magnetic head.

The planarizing film 8 enables the flatness of the magnetoresistive effective type element 20*c* to be developed with maintaining the sufficient electric contact between the electrode layers 9*c*, 9*c* and the magnetoresistive effective film 5. Since the electrode layers 9*c*, 9*c* are contacted with the rear surface 5*e* of the magnetoresistive effective film 5, the electric resistance between the electrode layers 9*c*, 9*c* and the magnetoresistive effective film 5, so that the heat generation therebetween can be reduced.

In the third embodiment, as mentioned above, the planarizing film 8 is provided so as to be contacted with the lower portion of the rear surface 5*e* of the magnetoresistive effective film 5 of the magnetoresistive effective type element 20*b* in the second embodiment. As another modified embodiment, a planarizing film is provided so as to be contacted with the lower portion of the rear surface 5*e* of the magnetoresistive effective film 5 of the magnetoresistive effective type element 20*a* in the first embodiment. In this case, the electrode layers are located on the planarizing film at the rear side of the magnetoresistive effective film 5 backward from the rear surface 5*e*.

The magnetoresistive effective film 5 may be made of an anisotropy magnetoresistive effective film made of NiFe or the like, or a giant magnetoresistive effective film having a spin-valve structure or a ferromagnetic tunnel junction structure.

Next, a method for fabricating a magnetoresistive effective type element according to the present invention will be described. FIGS. 18-27 are explanatory views showing fabricating steps in the fabricating method of the present invention. In this embodiment, the fabricating method for the magnetoresistive effective type element 20*b* in the above second embodiment will be described.

Figure 18:
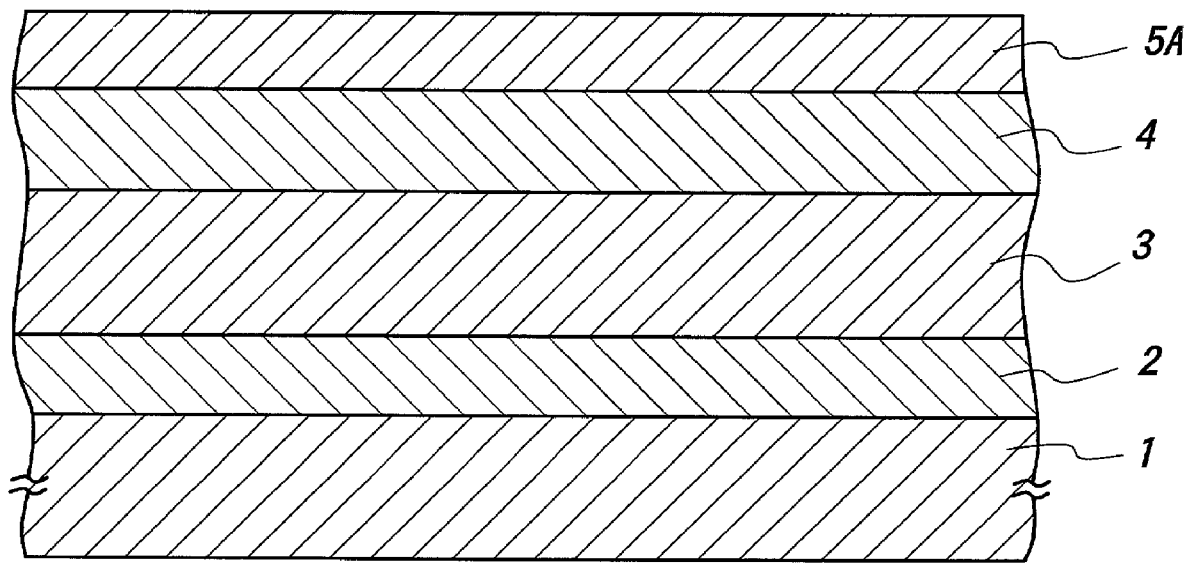
FIG. 18 is an explanatory view showing a fabricating step in a fabricating method of magnetoresistive effective type element according to the present invention.

First of all, as shown in FIG. 18, the base protective layer 2 is formed of Al$_2$O$_3$ or the like in a thickness of 2-10 μm on the base 1 made of AlTiC by means of sputtering. Then, the bottom shielding layer 3 is formed of a given magnetic material in a thickness of 1-3 μm on the base protective layer 2 by means of plating. Then, the bottom insulating layer 4 is formed of Al$_2$O$_3$ or AlN in a thickness 10-100 nm on the bottom shielding layer 3 by means of sputtering. Then, a multilayered magnetoresistive effective film 5A is formed uniformly in a thickness of 0.02-0.06 μm on the bottom insulating layer 4 by means of sputtering or the like.

After the formation of the magnetoresistive effective film 5A, a first resist mask 41 is selectively formed on the film 5A. The first resist mask 41 is preferably constructed of a two layered resist pattern of which the bottom layer is made of PMGI, so easy to be lifted off. Then, as shown in FIG. 19, the magnetoresistive effective film 5A is selectively etched by mean of milling treatment using the mask 41. In order to etch and remove the magnetoresistive effective film 5A in the thickness direction perfectly, the milling treatment is preferably carried out up to the surface area of the bottom insulating layer 4. In this way, a magnetoresistive effective film 5B as a prototype of the magnetoresistive effective film 5 is formed as shown in FIG. 19.

Figure 19A:
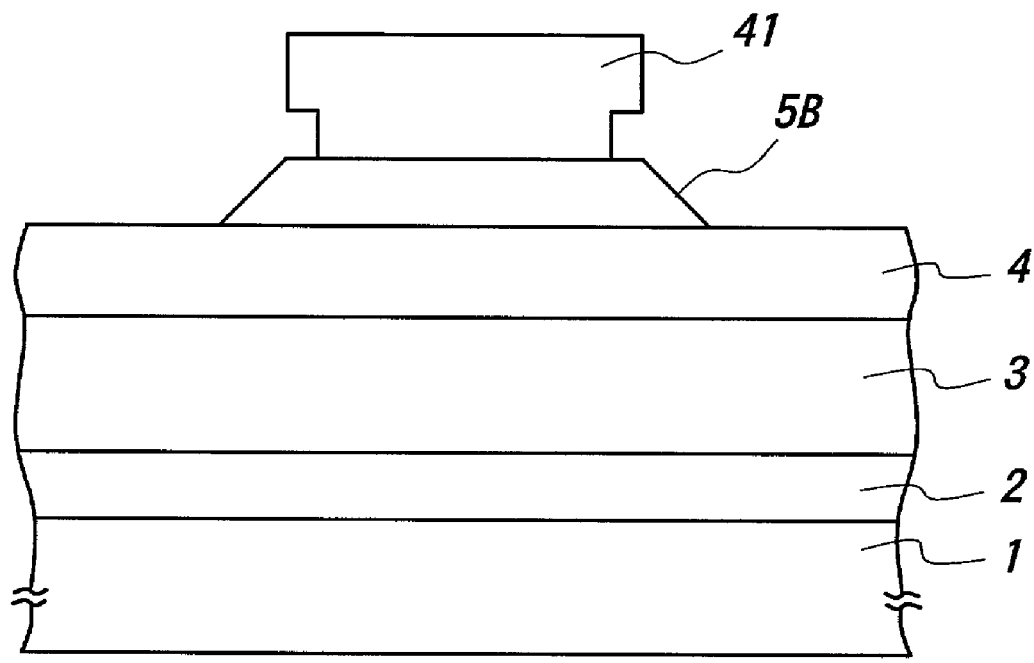
FIG. 19 is an explanatory view showing a fabricating step after the fabricating step shown in FIG. 18.
Figure 19B:
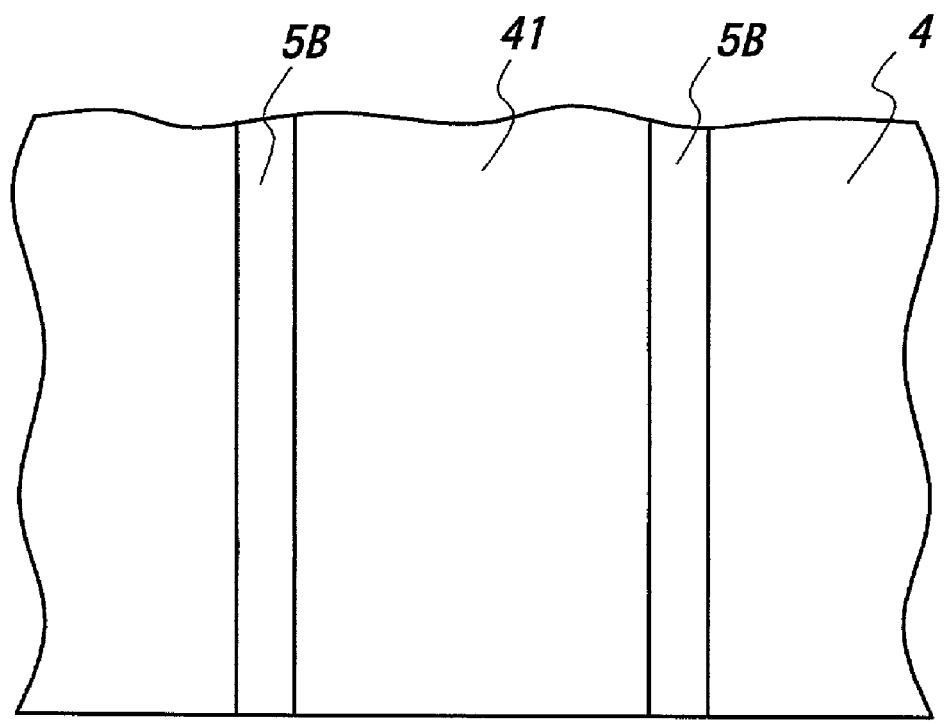

Both side surfaces of the magnetoresistive effective film 5B are inclined in the thickness direction on the above-etching step as shown in FIG. 19A. The magnetoresistive effective film 5B is elongated in a direction perpendicular to the ABS, that is, the Throat Height direction than the inherently desired length.

Figure 20A:
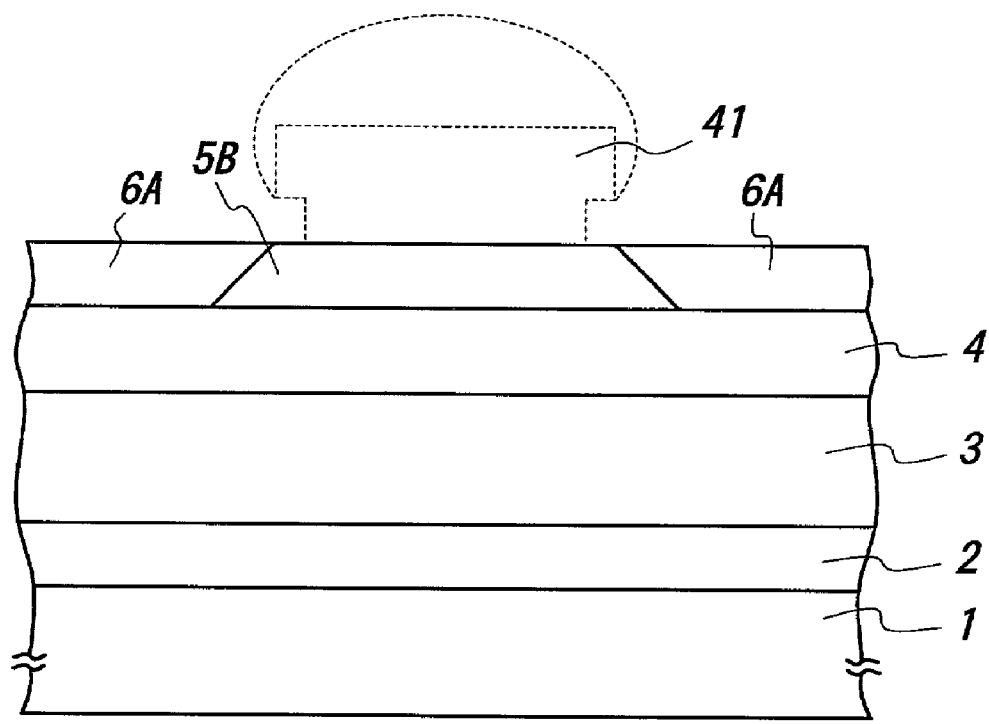
FIG. 20 is an explanatory view showing a fabricating step after the fabricating step shown in FIG. 19.

After the formation of the magnetoresistive effective film 5B, as shown in FIG. 20, magnetic biasing layers 6A, 6A are formed via the first resist mask 41 by means of sputtering. Not shown, an underfilm made of a Ta layer and a TiW layer and a ferromagnetic layer made of CoPt and magnetized in a given direction may be formed in turn before the magnetic biasing layers are formed.

Figure 20B:
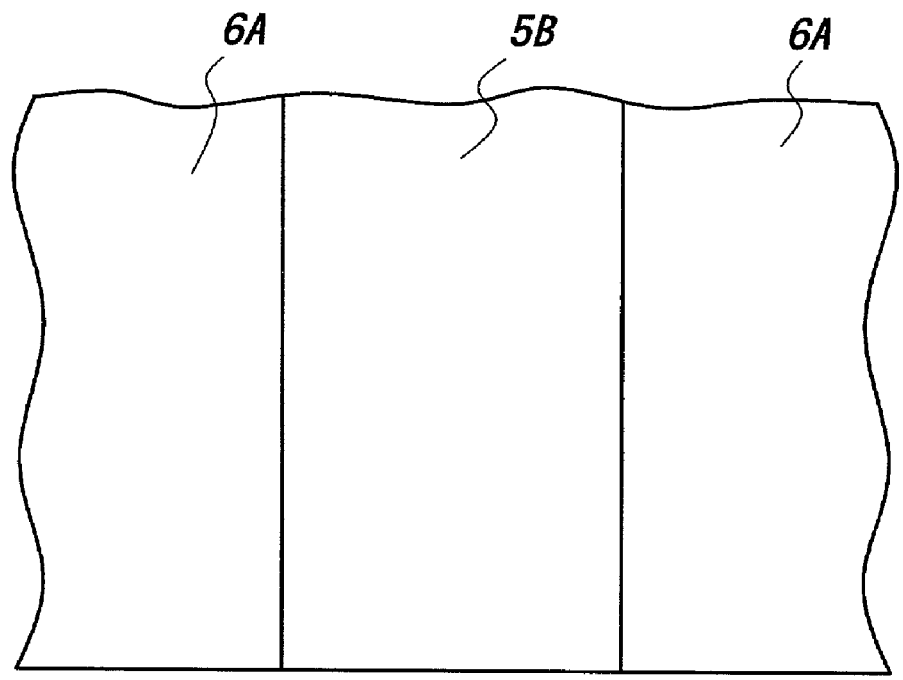

Thereafter, the first resist mask 41 and a magnetic biasing layer 6B stacked on the mask 41 which are designated by the dashed line. In this way, as shown in FIG. 20B, the magnetic biasing layers 6A, 6A are formed at both sides of the magnetoresistive effective film 5B.

Figure 21A:
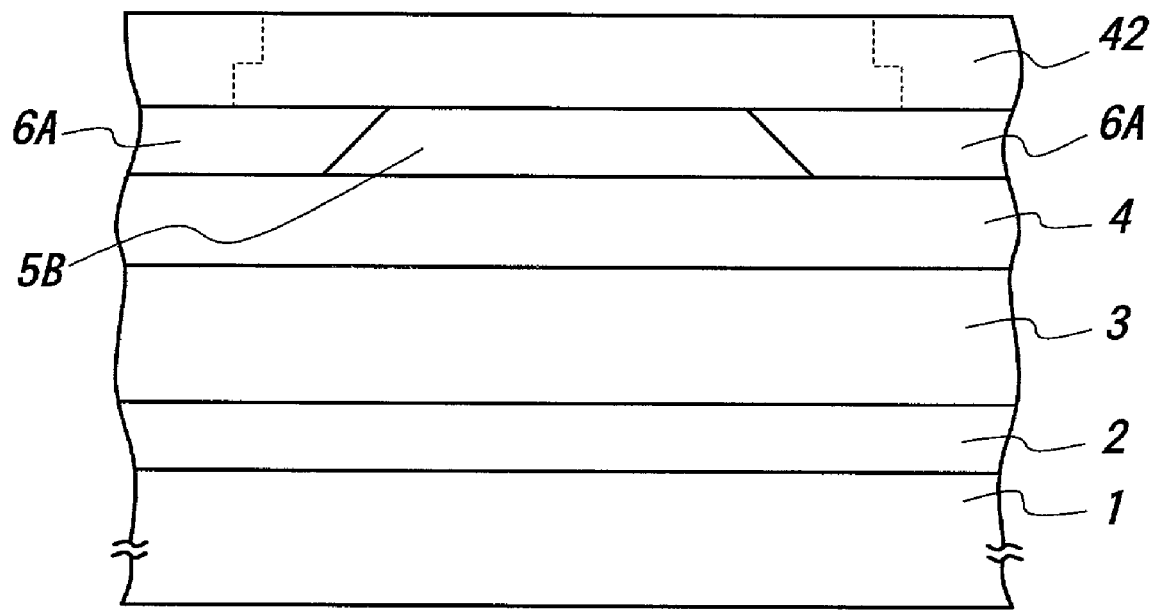
FIG. 21 is an explanatory view showing a fabricating step after the fabricating step shown in FIG. 20.
Figure 21B:
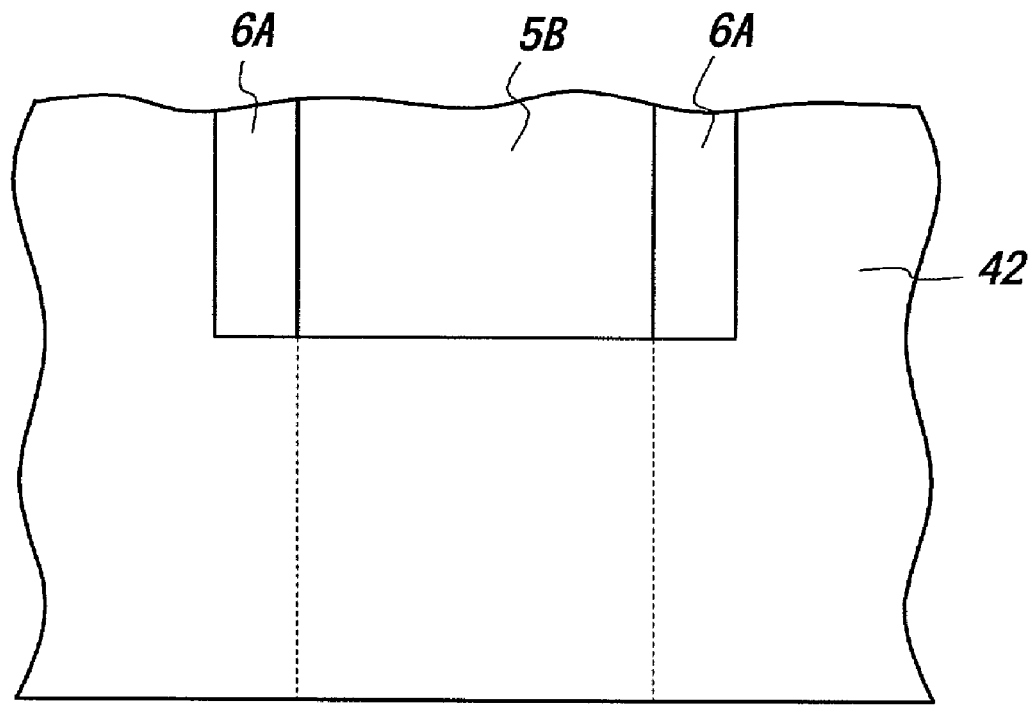

Then, as shown in FIG. 21, a second resist mask 42 is formed so as to cover the magnetoresistive effective film 5B and the magnetic biasing layers 6A, 6A. As shown in FIG. 21B, the second resist mask 42 is opened at a given distance from the ABS so as to expose portions of the magnetoresistive effective film 5 and the magnetic biasing layers 6A, 6A. In FIG. 21A, the dashed line designates the opening formed is designated by the dashed line. The second resist mask 42 is preferably constructed of a two layered resist pattern of which the bottom layer is made of PMGI, so easy to be lifted off as the first resist mask 41.

Figure 22A:
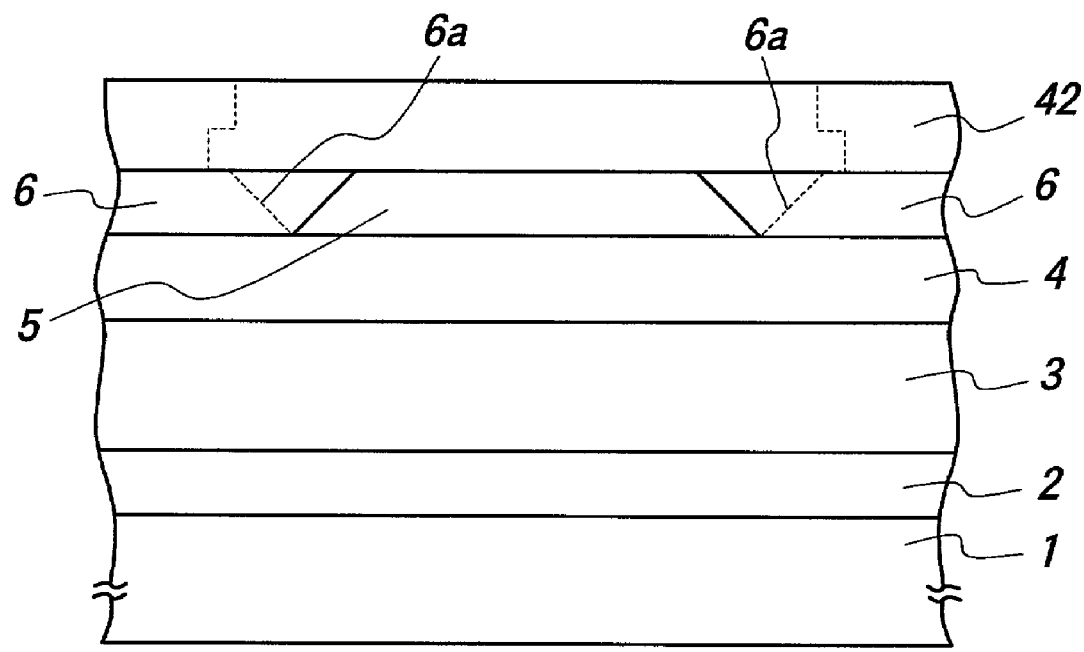
FIG. 22 is an explanatory view showing a fabricating step after the fabricating step shown in FIG. 21.
Figure 22B:
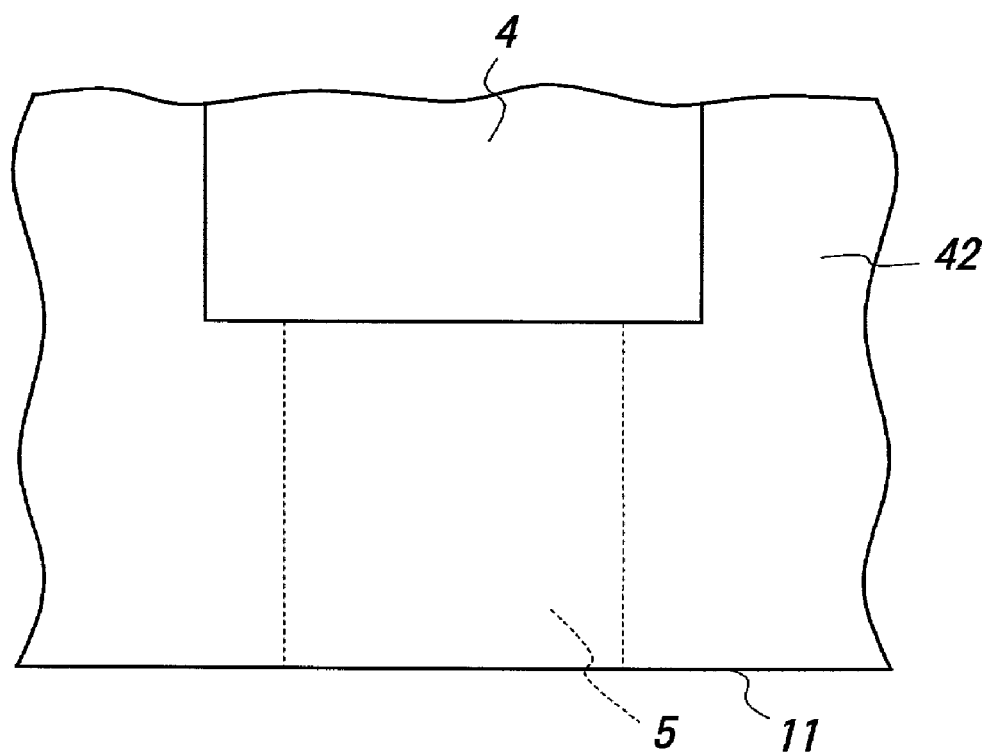

Thereafter, as shown in FIG. 22, the exposed portions of the magnetoresistive effective film 5B and the magnetic biasing layer 6A, 6A are etched and removed by means of milling treatment, to expose the bottom insulating layer 4. As a result, the rear surface 5e of the magnetoresistive effective film 5 opposite to the ABS is formed so as to be inclined in the thickness direction. Also, as shown in FIG. 22A, the magnetic biasing layer 6, 6 are formed so as to be inclined in the thickness direction on the above etching step as shown by the dashed line 6a.

The magnetic biasing layers 6, 6 are formed slightly thicker than the magnetoresistive effective film 5. In order to etch and remove the rear side of the magnetic biasing layers 6A, 6A perfectly, the milling treatment is preferably carried out up to the surface area of the bottom insulating layer 4.

Figure 23A:
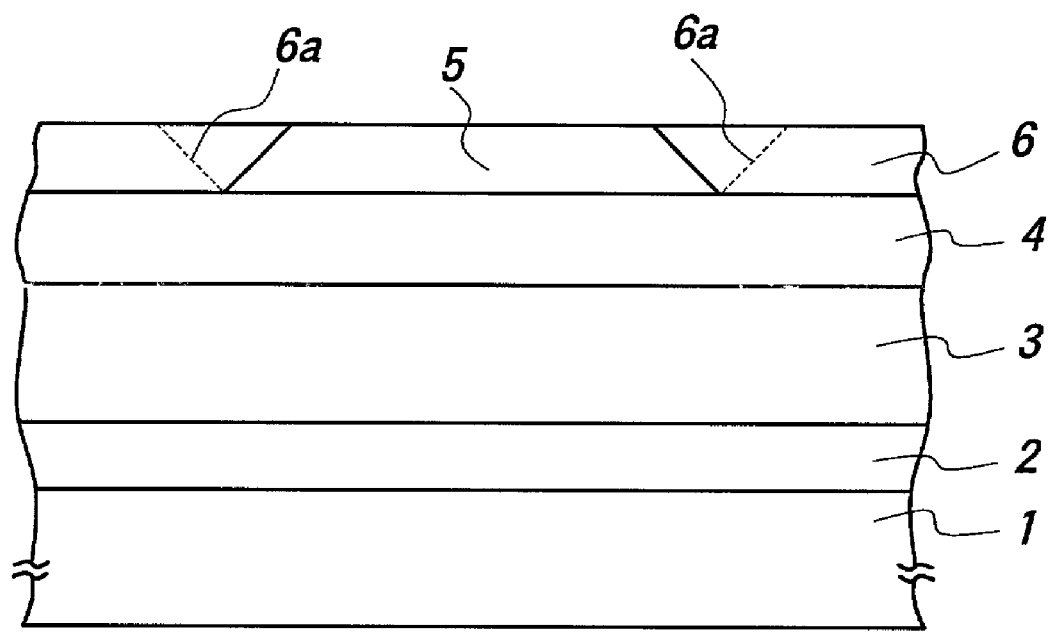
FIG. 23 is an explanatory view showing a fabricating step after the fabricating step shown in FIG. 22.
Figure 23B:
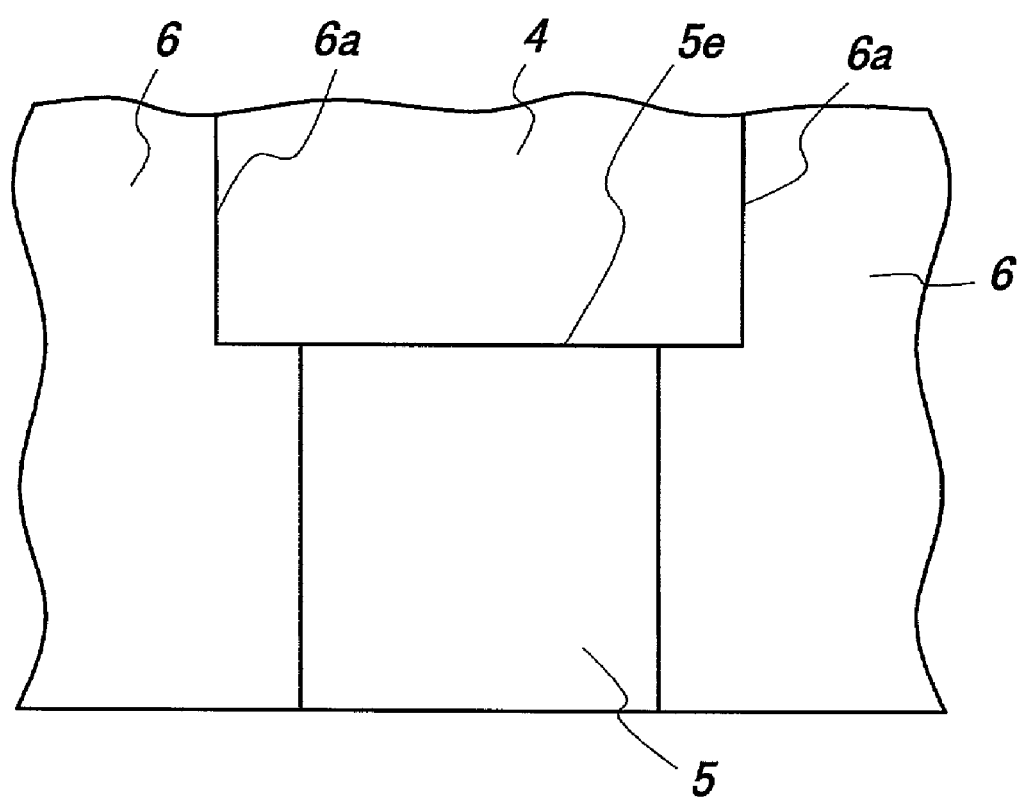

Then, as shown in FIG. 23, the second resist mask 43 is lifted off, and the magnetoresistive effective film 5, the magnetic biasing layers 6, 6 and the bottom insulating layer 4 are partially exposed as shown in FIG. 23B.

Figure 24A:
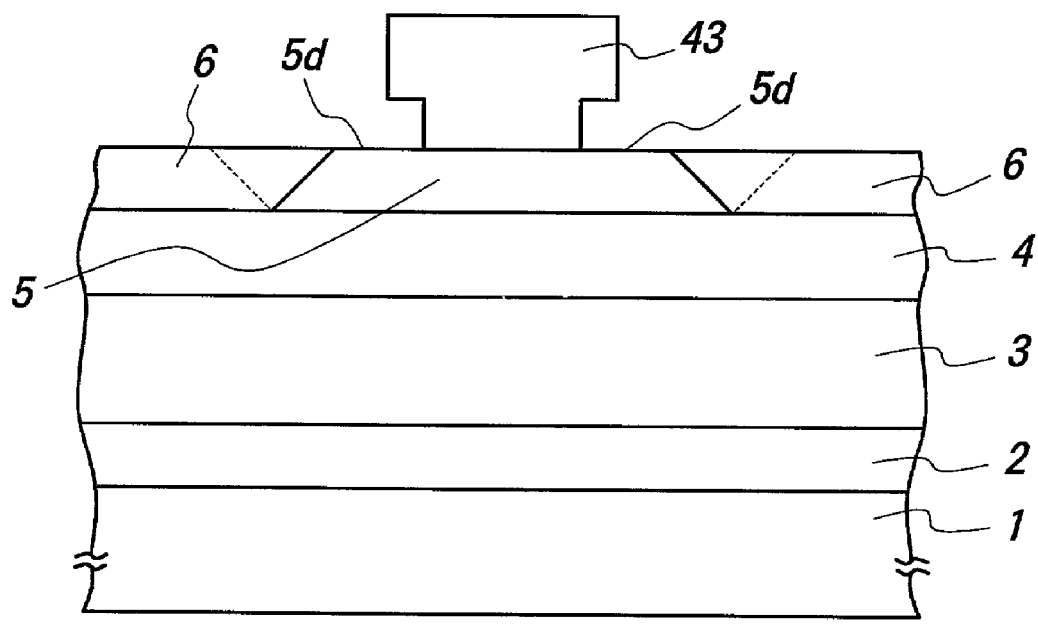
FIG. 24 is an explanatory view showing a fabricating step after the fabricating step shown in FIG. 23.
Figure 24B:
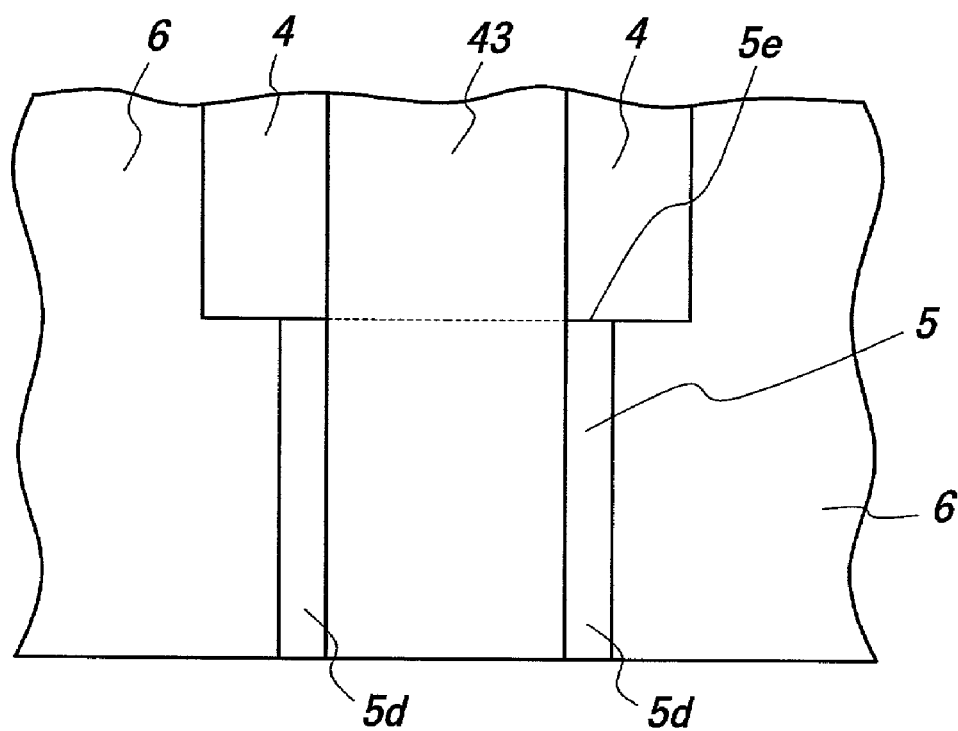

Then, as shown in FIG. 24, a third resist mask 43 is formed in a T-shaped cross section on the magnetoresistive effective film 5. In this case, the third resist mask 43 is preferably constructed of a two layered resist pattern of which the bottom layer is made of PMGI. As is apparent from FIG. 24, the width of the third resist mask 43 is set smaller than the width of the magnetoresistive effective film 5. Then, the third resist mask 43 is elongated to the rear side of the magnetoresistive effective film 5 opposite to the ABS from the rear surface 5e thereof. Therefore, the edge portions 5d and the rear surface 5e are partially exposed from the third resist mask 43.

Figure 25A:
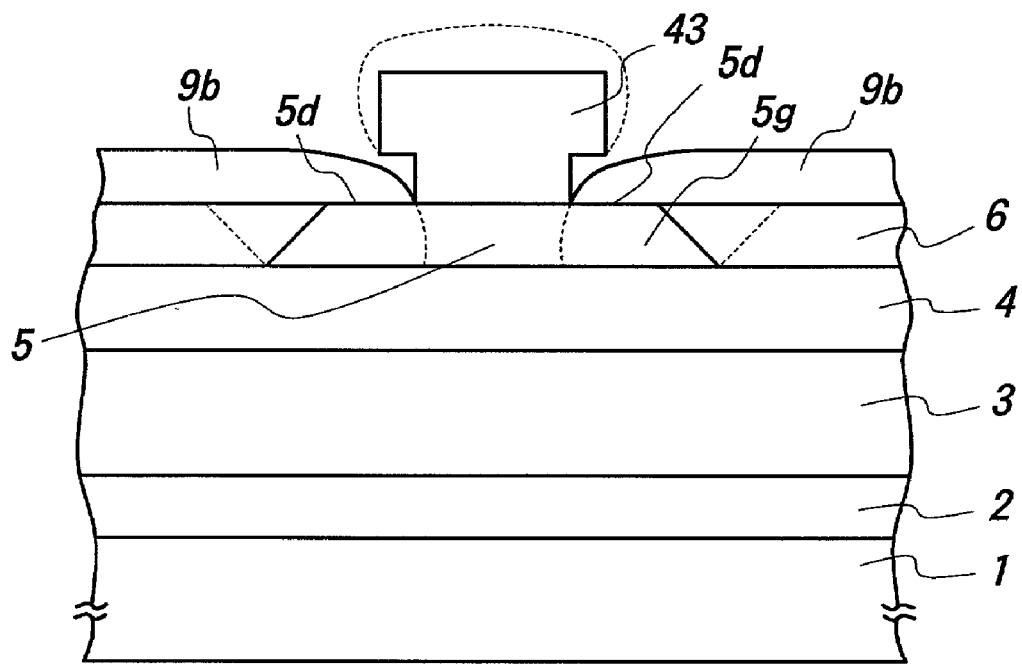
FIG. 25 is an explanatory view showing a fabricating step after the fabricating step shown in FIG. 24.
Figure 25B:
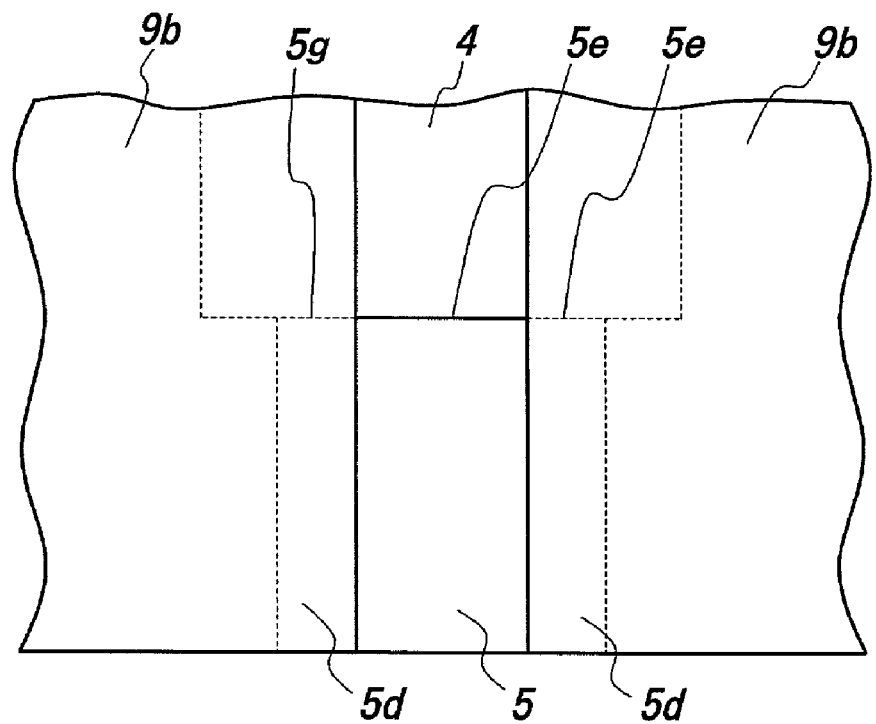

Then, as shown in FIG. 25, the electrode layers 9b, 9b are formed via the third resist mask 43 designated by the dashed line by means of a conventional film forming method. The electrode layers 9b, 9b are preferably made of Au or a multilayered film of W layer/Ta layer. Since the edge portions 5d of the top surface 5a of the magnetoresistive effective film 5 are exposed from the third resist mask 43, the electrode layers 9b, 9b are so formed as to be contacted with the edge portions 5d thereof. Moreover, since the rear surface 5e of the magnetoresistive effective film 5 is partially exposed from the third resist mask 43, the electrode layers 9b, 9b are so formed as to be contacted with the rear contacting area 5g of the rear surface 5e.

Then, the third resist mask 43 designated by the dashed line and the debris stacked on the mask 43 are lifted off and removed. As a result, the magnetoresistive effective type element 20b in the second embodiment can be obtained.

Figure 26A:
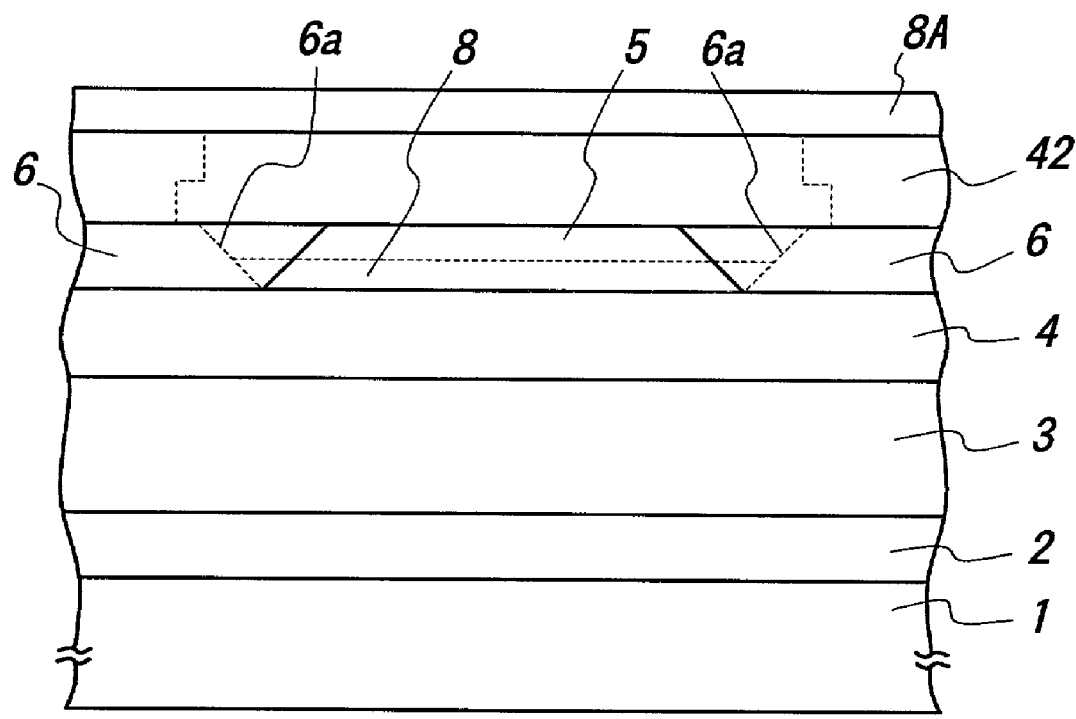
FIG. 26 is an explanatory view showing a fabricating step after the fabricating step shown in FIG. 25.
Figure 26B:
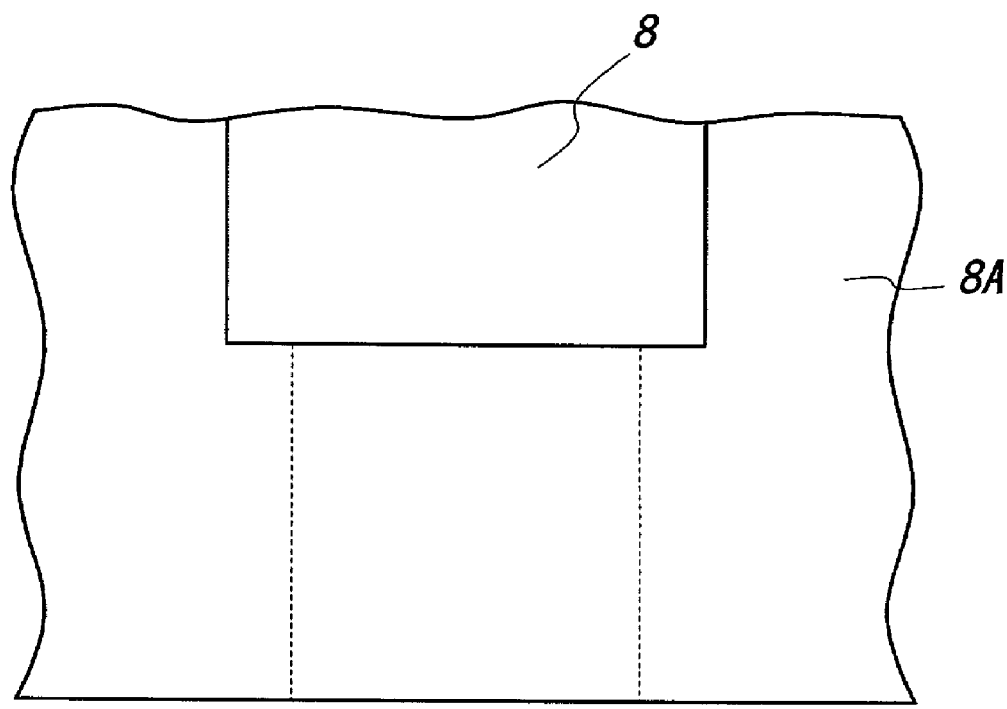

Next, the fabricating method for the magnetoresistive effective type element 20c including the planarizing film 8 will be described. First of all, according to the fabricating steps shown in FIGS. 18-22, the magnetoresistive effective film 5B and the magnetic biasing layers 6A, 6A are formed, and then, the resist mask 42 is formed so as to partially expose the film 5B and the layers 6A, 6A. Then, the exposed portions of the film 5B and the layers 6A, 6A are etched and removed to partially expose the bottom insulating layer 4. Then, as shown in FIG. 26, an insulating film 8A is formed of $Al_2O_3$ or the like on the resist mask 42. Since the bottom insulating film 4 is partially exposed from the resist mask 42, the insulating film 8A is formed directly on the bottom insulating layer 4 via the opening of the resist mask 42. As a result, the planarizing film 8 is made of the insulating film 8A on the bottom insulating layer 4. The thickness of the planarizing film 8 is set within 0.01-0.03 μm. The planarizing film 8 is contacted with the lower portion of the rear surface 5e of the magnetoresistive effective film 5.

Figure 27A:
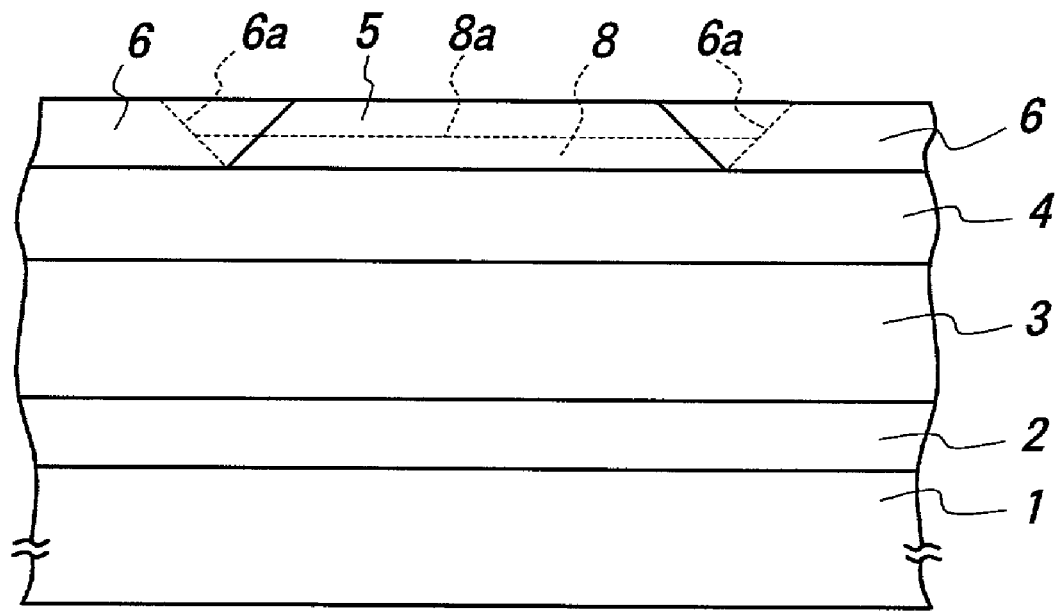
FIG. 27 is an explanatory view showing a fabricating step after the fabricating step shown in FIG. 26.
Figure 27B:
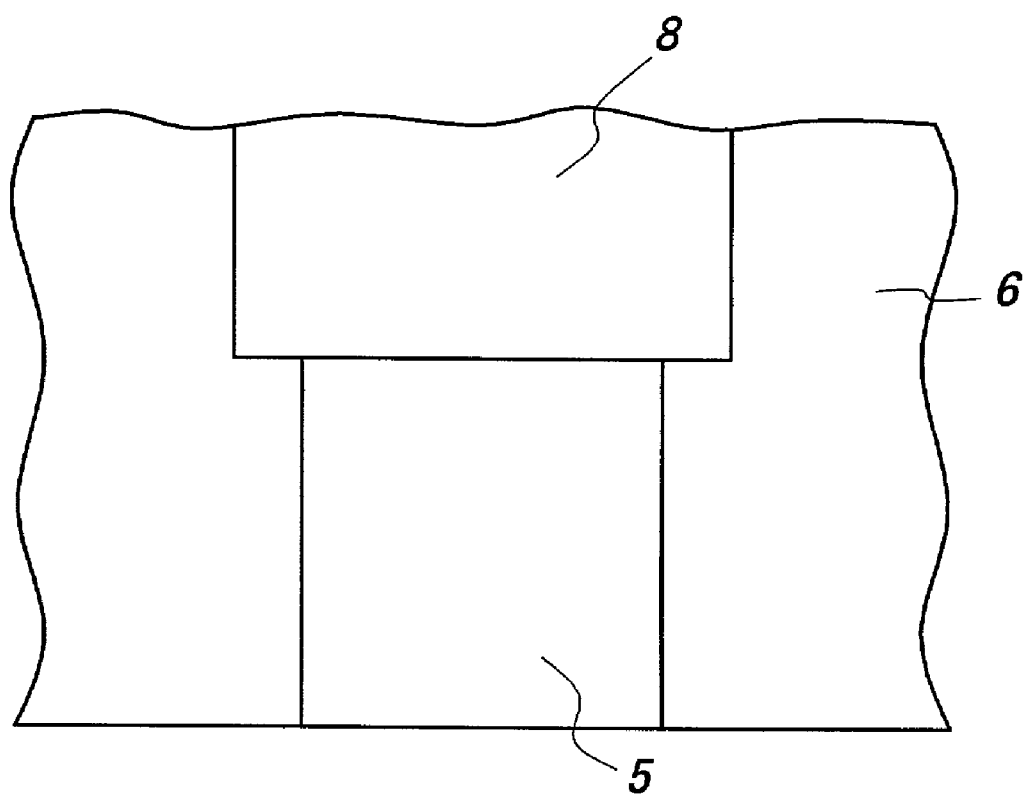

Then, as shown in FIG. 27, the resist mask 43 and the remaining debris on the mask 43 are lifted off and removed. In this fabricating step, the upper portion of the rear surface 5e of the magnetoresistive effective film S is exposed. Thereafter, the fabricating steps shown in FIGS. 24 and 25 are carried out, and the electrode layers 9c, 9c are formed so as to be contacted with the upper portion 5h of the rear surface 5e of the magnetoresistive effective film 5. In this way, the magnetoresistive effective type element 20c is provided.

The magnetoresistive effective type element 20a can be also fabricated in the same manner as mentioned above. Concretely, the resist mask is designed so that the electrode layers 9a, 9a are contacted with the edge portions 5c of the top surface 5a of the magnetoresistive effective film 5 and the edge portion areas of the rear surface 5e thereof opposite to the ABS 11.

Figure 28A:
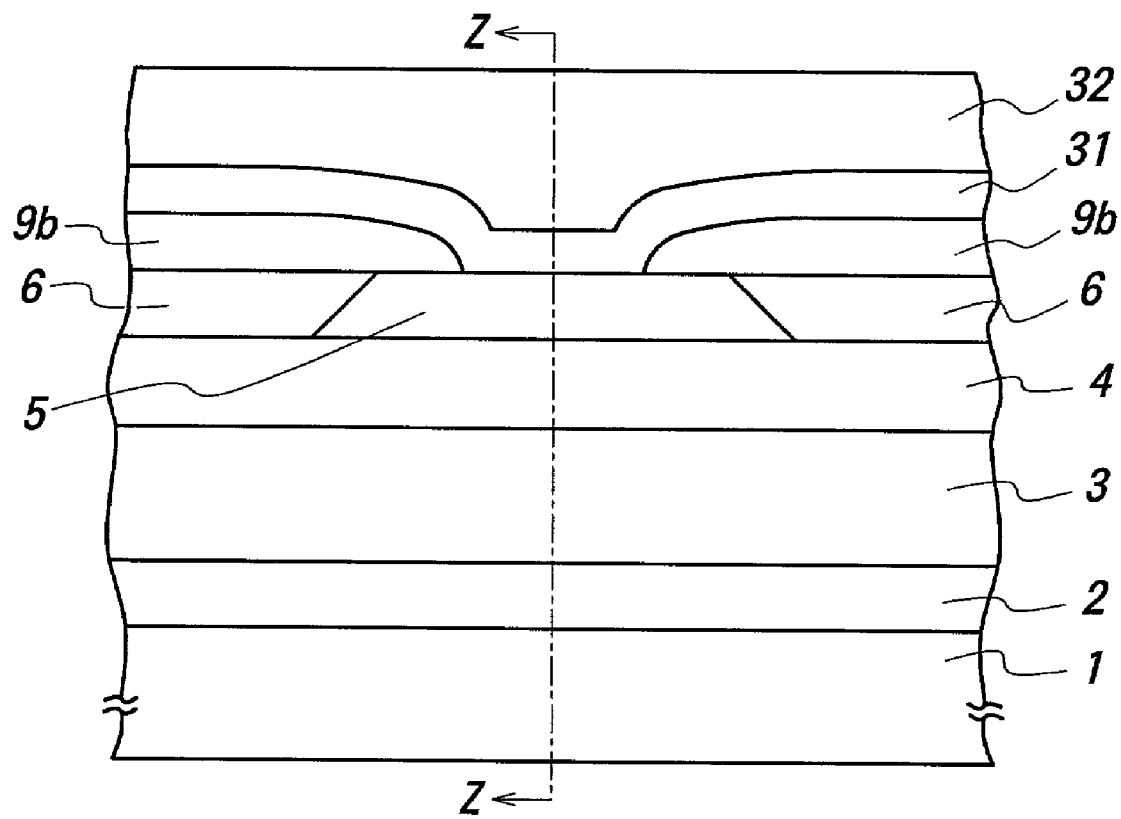
FIG. 28 is an explanatory view showing a fabricating step in a fabricating method of a composite type thin film magnetic head including a magnetoresistive effective type element according to the present invention.
Figure 28B:
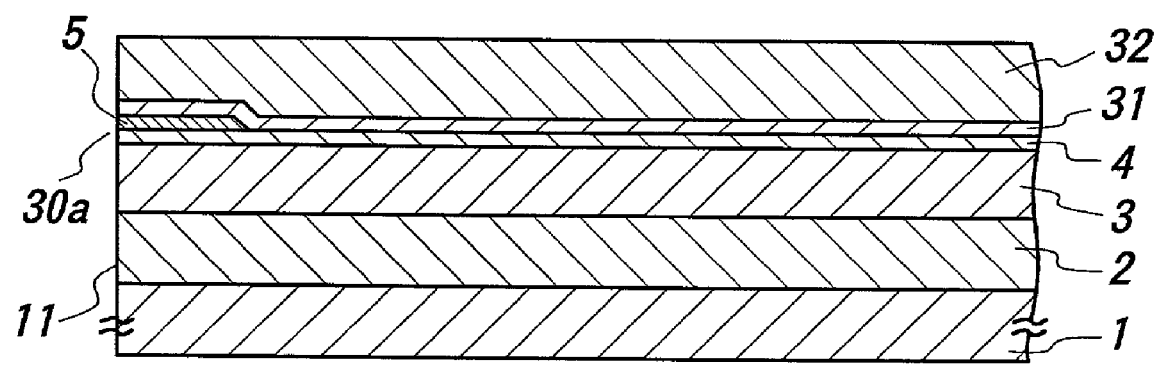
Figure 29:
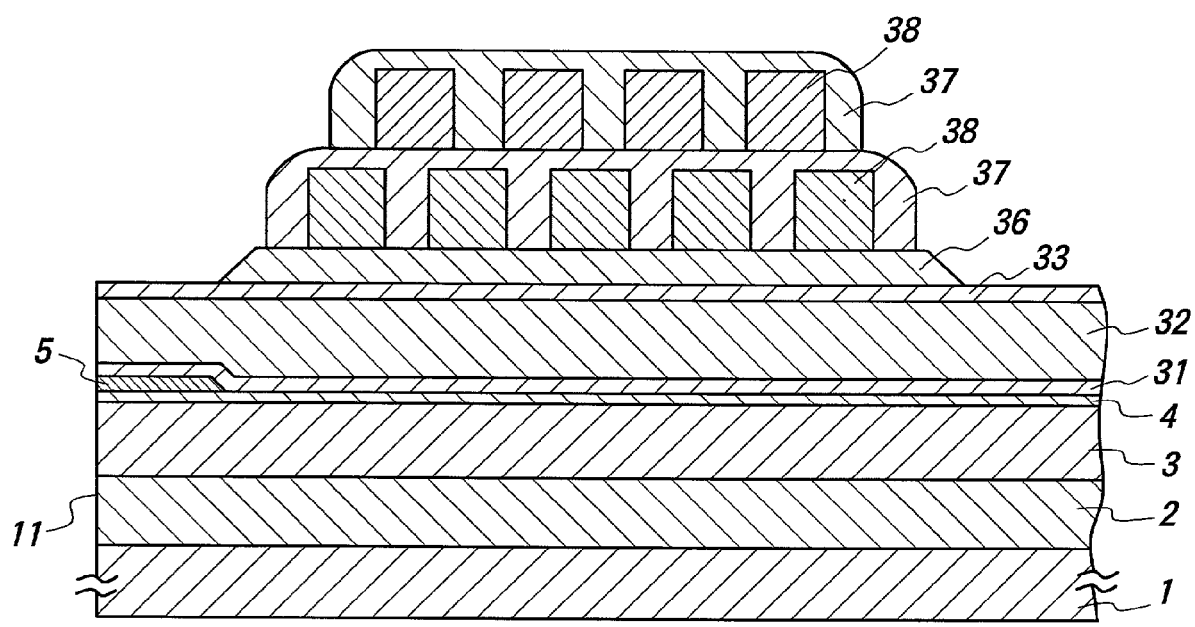
FIG. 29 is an explanatory view showing a fabricating step after the fabricating step shown in FIG. 28.
Figure 30:
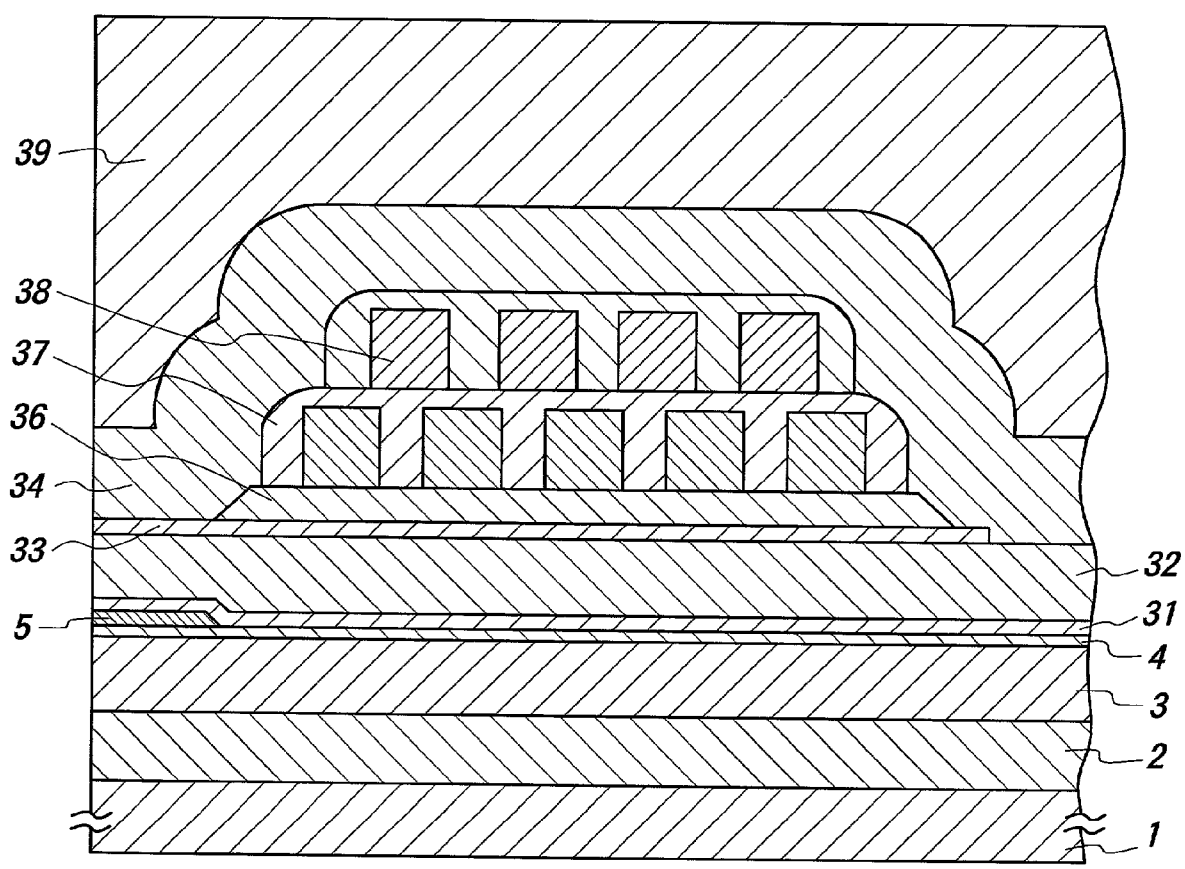
FIG. 30 is an explanatory view showing a fabricating step after the fabricating step shown in FIG. 29.
Figure 31:
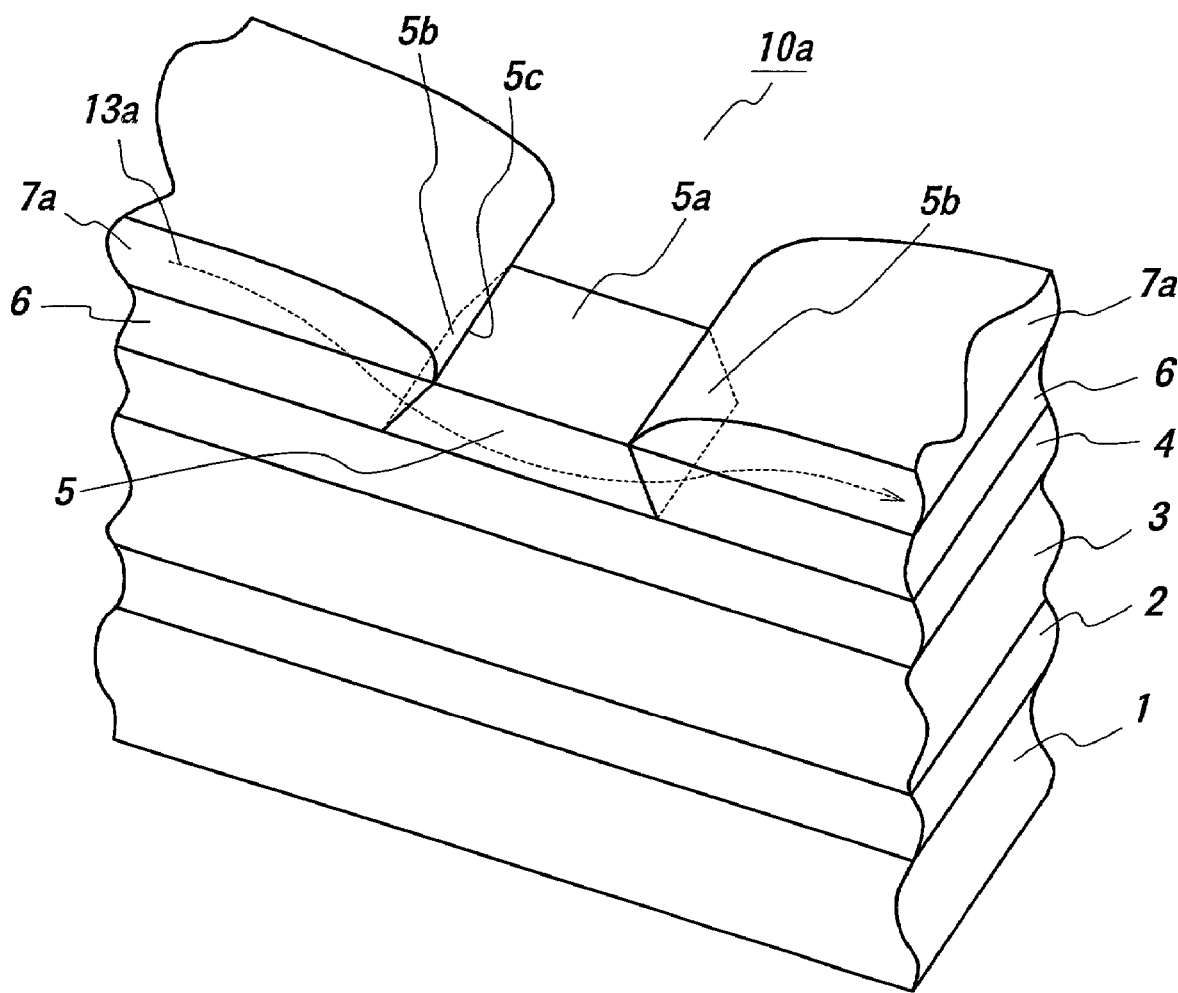
FIG. 31 is a perspective view showing a conventional magnetoresistive effective type element.

Next, a method for fabricating a composite type magnetoresistive effective type element including a magnetoresistive effective type element according to the present invention, with reference to FIGS. 28-30. FIG. 28 shows one step of fabricating a recording head section on the magnetoresistive effective type element 20a, 20b or 20c as a reproducing head section. First of all, the top insulating film 31 is formed of an insulating material such as $Al_2O_3$ in a thickness of 10-100 nm on the reproducing head section 30a by means of sputtering. Then, the top shielding layer 32 is formed of a magnetic material in a thickness of 1-4 μm on the top insulating film 31. FIG. 28A is an elevational view of the multilayered structure, as viewed from the ABS, and FIG. 28B is a cross sectional view of the multilayered structure, taken on line Z-Z. As is apparent from FIG. 28, the magnetoresistive effective film 5 is embedded in between the bottom shielding layer 4 and the top insulating layer 31.

After the formation of the top shielding layer 32, the write gap layer 33 is formed of an insulating material in a thickness of 0.1-0.5 μm on the top shielding layer 32 by means of sputtering, and the photoresist layer 36 is formed in a predetermined pattern with a thickness of about 1.0-2.0 μm. Thereafter, the thin film coil 38 is formed in a thickness of 1-3 μm on the photoresist layer 36, and the photoresist layer 37 is formed in a predetermined pattern so as to cover the thin film coil 38. In this embodiment, the thin film coil 38 has a two layered structure.

After the formation of the photoresist layer 36, not shown, the write gap layer 33 is partially etched to form a contact hole to complete a given magnetic circuit. Then, the top magnetic pole portion 34 is formed of a magnetic material having a higher saturated magnetic flux density in a thickness of about 3 μm so as to cover the write gap layer 33, the contact hole, the photoresist layers 36 and 37. Thereafter, the write gap layer 33 and the top shielding layer 32 are partially etched by means of ion milling using the top magnetic pole portion 34 as a mask. Then, the overcoat layer 39 is formed of Al$_2$O$_3$ in a thickness of 20-30 μm on the top magnetic pole portion 34.

At last, the resulting multilayered structure is mechanical processed and polished to form the ABS and thus, complete the thin film magnetic head shown in FIGS. 1 and 2.

Although the present invention was described in detail with reference to the above examples, this invention is not limited to the above disclosure and every kind of variation and modification may be made without departing from the scope of the present invention.

In the magnetoresistive effective type element of the present invention, as mentioned above, the electrode layers are formed so as to be contacted with at least one portion of the rear surface of the magnetoresistive effective film, as well as the side surfaces thereof. Therefore, the electric contacting area between the electrode layers and the magnetoresistive effective film is increased, and thus, the electric resistance therebetween can be decreased.

As a result, the heat generation therebetween can be also reduced. Also, since the electric resistance between the reading terminals for the magnetoresistive effective type element can be decreased, the design margin of the electric circuit to process information read can be enlarged. Moreover, the difference between the optical track width and the magnetic track width can be decreased, so that information can be read and output as designed with maintaining the effective track width.

What is claimed is:

1. A magnetoresistive effective type device comprising:
   a magnetoresistive effective film element having an air bearing surface, a top surface substantially perpendicularly continued from said air bearing surface, side surfaces continued from said top surface and a rear surface continued from said side surfaces opposite to said air bearing surface, an entire surface area of the magnetoresistive effective film element forming the air bearing surface lying in a plane of the air bearing surface,
   a magnetic biasing layer to apply a biasing magnetic field for said magnetoresistive effective film element which is formed so as to be contacted completely over said side surfaces of said magnetoresistive effective film element,
   a pair of electrode layers to flow a current for signal detection in said magnetoresistive effective film element, the electrode layers being formed so as to be contacted with at least one portion of said rear surface of said magnetoresistive effective film element, and
   a planarizing film formed only at the opposite side of the magnetoresistive effective film element to the air bearing surface, without being formed beneath the magnetoresistive effective film element, the planarizing film formed so as to be contacted with a lower portion of said rear surface of said magnetoresistive effective film element, wherein said pair of electrode layers are formed on said planarizing film.

2. A magnetoresistive effective type device as defined in claim 1, wherein said pair of electrode layers are contacted with edge portions of said magnetoresistive effective film element.

3. A magnetoresistive effective type device as defined in claim 1, wherein said pair of electrode layers are contacted with edge portions of said top surface of said magnetoresistive effective film element.

4. A thin film magnetic head comprising, as a reading element, a magnetoresistive effective type device as defined in claim 1.

5. A thin film magnetic head as defined in claim 4, further comprising a writing element.

6. A magnetic head device comprising a thin film magnetic head as defined in claim 4 and a head supporting device to support said thin film magnetic head.

7. A magnetic disk drive device comprising a magnetic head device as defined in claim 6 and a magnetic disk to be recorded and reproduced magnetically by means of said magnetic head device.

* * * * *